US009064826B2

(12) United States Patent
Nakazawa

(10) Patent No.: US 9,064,826 B2
(45) Date of Patent: Jun. 23, 2015

(54) ORGANIC ELECTROLUMINESCENT DISPLAY DEVICE AND CIRCULARLY POLARIZING PLATE

(71) Applicant: Konica Minolta, Inc., Tokyo (JP)

(72) Inventor: Yukihito Nakazawa, Kobe (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/359,344

(22) PCT Filed: Nov. 13, 2012

(86) PCT No.: PCT/JP2012/079324
§ 371 (c)(1),
(2) Date: May 20, 2014

(87) PCT Pub. No.: WO2013/077220
PCT Pub. Date: May 30, 2013

(65) Prior Publication Data
US 2014/0332786 A1    Nov. 13, 2014

(30) Foreign Application Priority Data
Nov. 25, 2011    (JP) ................. 2011-257104

(51) Int. Cl.
H01L 51/00    (2006.01)
H01L 27/32    (2006.01)
(Continued)

(52) U.S. Cl.
CPC .............. *H01L 27/3244* (2013.01); *G09F 9/00* (2013.01); *G09F 9/30* (2013.01); *G02B 5/3025* (2013.01); *G02B 5/3083* (2013.01); *G02B 2207/113* (2013.01); *H01L 51/5281* (2013.01); *H01L 51/5012* (2013.01); *H01L 51/5275* (2013.01); *H01L 51/0031* (2013.01); *H01L 51/5253* (2013.01); *H01L 2251/55* (2013.01)

(58) Field of Classification Search
CPC ............ H01L 27/3244; H01L 51/5012; H01L 51/5275; H01L 51/5281; G02B 5/3083; G02B 5/3025; G02B 2207/113; G09F 9/30; G09F 9/00
See application file for complete search history.

(56) References Cited

FOREIGN PATENT DOCUMENTS
JP    11-002722    1/1999
JP    11-52133    2/1999
(Continued)

OTHER PUBLICATIONS
International Preliminary Report on Patentability and Written Opinion in Japanese and English. Date of issuance: May 27, 2014 (14 pages).

*Primary Examiner* — Roy Potter
*Assistant Examiner* — Paul Patton
(74) *Attorney, Agent, or Firm* — Lucas & Mercanti, LLP

(57) ABSTRACT

The objective of the present invention is to provide: a circularly polarizing plate which comprises a λ/4 retardation film and has excellent visibility, excellent durability (resistance to image unevenness) and excellent resistance to panel deterioration (flatness) after storage in a high-temperature high-humidity environment for a long period of time; and an organic electroluminescent display device which uses the circularly polarizing plate. This organic electroluminescent display device comprises, from the viewing side, a protective film, a polarizer, a λ/4 retardation film and an organic electroluminescent element in this order, and is characterized in that at least one surface of the λ/4 retardation film has a layer A which has a storage modulus of from 100 MPa to 500 MPa (inclusive).

8 Claims, 8 Drawing Sheets

(51) Int. Cl.
  *G09F 9/00* (2006.01)
  *G09F 9/30* (2006.01)
  *G02B 5/30* (2006.01)
  *H01L 51/52* (2006.01)
  *H01L 51/50* (2006.01)

(56) References Cited

FOREIGN PATENT DOCUMENTS

| | | | | |
|---|---|---|---|---|
| JP | 2003-227933 A | 8/2003 | | |
| JP | 2008046495 | * 8/2006 | ............... | G02B 5/30 |
| JP | 2006-301169 A | 11/2006 | | |
| JP | 2006301169 | * 11/2006 | ............. | G02F 1/1335 |
| JP | 2008-046495 A | 2/2008 | | |
| JP | 2009244486 | * 3/2008 | ............... | G02B 5/30 |
| JP | 2008-165199 A | 7/2008 | | |
| JP | 2009-186995 A | 8/2009 | | |
| JP | 2009-244486 A | 10/2009 | | |
| JP | 2011-113018 A | 6/2011 | | |
| JP | 2011113018 | * 6/2011 | ............... | G02B 5/30 |

* cited by examiner

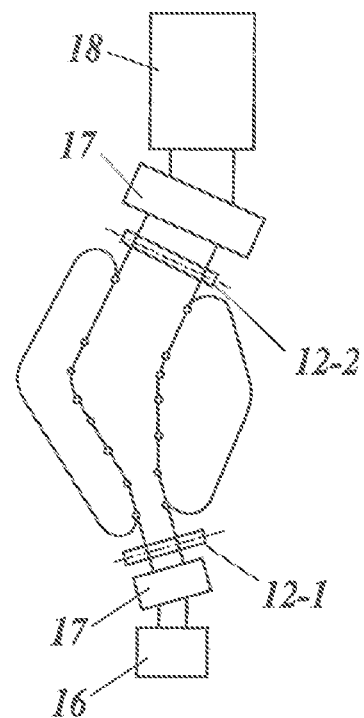

US 9,064,826 B2

ORGANIC ELECTROLUMINESCENT DISPLAY DEVICE AND CIRCULARLY POLARIZING PLATE

CROSS REFERENCE TO RELATED APPLICATION

This Application is a 371 of PCT/JP2012/079324 filed on Nov. 13, 2012 which, in turn, claimed the priority of Japanese Patent Application No. JP2011-257104 filed on Nov. 25, 2011 both applications are incorporated herein by reference.

TECHNICAL FIELD

The present invention relates to a circularly polarizing plate including a $\lambda/4$ retardation film, and an organic electroluminescent display device including the circularly polarizing plate and an organic electroluminescent element.

BACKGROUND ART

Organic electroluminescent elements (hereinafter abbreviated as "organic EL elements"), which emit light from a luminescent layer provided between two electrodes in response to voltage applied to the electrodes, have been intensively studied and developed for various light sources, such as flat-panel illumination devices, light sources for optical fibers, backlights for liquid crystal displays and liquid crystal projectors, and other display devices. The recent interest especially in the above-mentioned industrial fields has been particularly focused on the organic EL elements, which are advantageous to high luminous efficiency, low voltage driving, light weight, and low costs.

The organic EL elements allow electrons to be injected from the cathode and holes to be injected from the anode and recombine the electrons and holes at the luminescent layer to generate visible light corresponding to the luminescent properties of the luminescent layer.

A typical anode is composed of indium tin oxide (hereinafter abbreviated as "ITO"), which has the highest electrical conductivity, a higher work function, and a higher efficiency of hole injection among transparent conductive materials.

A typical cathode is a metal electrode, which is typically composed of Mg, Mg/Ag, Mg/In, Al, or Li/Al, to ensure the efficiency of electron injection and the work function.

These metals have a high light reflectance, and can reflect the light from the luminescent layer to increase the intensity of emitted light (luminance), in addition to the function as an electrode (cathode). That is, the light directed toward the cathode is specularly reflected by the surface of the metal cathode and emerges from the transparent ITO electrode (anode).

Unfortunately, the organic EL element including such a specular cathode having a high light reflectance significantly reflects external light in a non-luminescent mode.

In other words, the display is disturbed by external light such as interior illumination and cannot express dark colors at bright sites. The organic EL element has too low contrast at bright sites to be used as a light source for a display device.

To prevent the reflection of external light, for example, Japanese Unexamined Patent Application Publication No. H8-321381 discloses a technique using a circular polarizer (also referred to as "circularly polarizing plate"). A typical circularly polarizing plate includes a protective film, a polarizer, and a $\lambda/4$ retardation film, in sequence from a viewer side.

The $\lambda/4$ retardation film for the circularly polarizing plate, which shows a higher retardation than a typical retardation film for a large liquid crystal display device, must be stretched at a higher rate to have a smaller thickness and achieve a retardation $\lambda/4$. Unfortunately, the studies of the present inventors revealed that the $\lambda/4$ retardation film fabricated by the high-rate stretching is readily affected by its storage conditions such as temperature and humidity and the organic solvents. For example, the $\lambda/4$ retardation film after the storage in a high-temperature high-humidity environment shows a large variation in size.

The circularly polarizing plate including such a $\lambda/4$ retardation film significantly curves due to the large difference in size variation rate between the protective film and the $\lambda/4$ retardation film, especially after the storage under conditions readily causing a size variation. This phenomenon leads to warpage of the plate and unavoidable reflection of external light. The curve of the circularly polarizing plates is not problematic in a conventional liquid crystal display device, which includes two polarizing plates disposed on both sides of a liquid crystal cell and mutually cancelling the effects of the curves.

In contrast, in the organic electroluminescent display device including only a single circularly polarizing plate on a viewer side, the curve of the circularly polarizing plate significantly affects the warpage of the organic electroluminescent display device. The repeated use under large variations in the temperature and humidity significantly deteriorates the organic electroluminescent display device.

Some conventional techniques are disclosed against the problems. For example, an elliptical polarizer is disclosed which includes a polarized-light separating film laminated on a quarter wavelength plate via an adhesive layer showing an excellent stress relaxation (refer to Patent Documents 1 and 2, for example). The adhesive layer is composed mainly of an acrylic polymer and has a relaxation modulus of 0.2 to 10 MPa. The adhesive layer prevents the photoelastic relaxation caused by the stress relaxation due to the internal heat of the laminate, to reduce the reflection loss of light and increase the use efficiency of light.

The present inventors checked for the visibility of the organic electroluminescent display device or the circularly polarizing plate having the configuration disclosed in Patent Documents 1 and 2 after the storage in a high-temperature high-humidity environment, and found that the shrinkage of both the $\lambda/4$ retardation film and the protective film in the circularly polarizing plate significantly affects the reflection of external light. This phenomenon is probably caused by the adhesive layer for the stress relaxation, which can prevent transmission of the stress from the shrinking layer to the $\lambda/4$ retardation film, but cannot sufficiently prevent a variation in size of the $\lambda/4$ retardation film itself due to variations in the temperature and humidity.

Another technique uses an elliptically polarizing plate, which includes a linearly polarizing plate, a first adhesive layer, a retardation plate, a second adhesive layer, an optical compensation plate (liquid crystal layer), and a third adhesive layer in this sequence, and has a storage elastic modulus of the second adhesive layer greater than that of the third adhesive layer (e.g., refer to Patent Document 3). The technique in Patent Document 3 can provide an elliptically polarizing plate having a small thickness and reducing cracks in a thermal shock test and creases due to the shrinkage of the linearly polarizing plate. Patent Document 3, however, does not disclose or suggest the stability of color tone or the visibility in the organic electroluminescent display device or the circularly polarizing plate including the $\lambda/4$ retardation film after the storage in a high-temperature high-humidity environment, although this problem is peculiar to circularly polarizing plates including λ/4 retardation films.

The organic electroluminescent element is readily deteriorated by uv rays. It is therefore desirable that any layer from the protective film of the circularly polarizing plate to the surface of the organic electroluminescent element have high uv absorptivity.

Unfortunately, if the protective film contains an increased amount of a uv absorbing agent to achieve high uv absorptivity, for example, the agent increases the haze and bleeds out. In addition, during application of a surface coating on such a protective film, the excess uv absorbing agent may be eluted from the protective film.

Most of the uv absorbing agents are immiscible with a polycarbonate resin and a cyclo olefin resin, which are typical components in the existing λ/4 retardation films. The uv absorbing agent therefore bleeds out and deteriorates the optical characteristics of the λ/4 retardation film.

To solve these problems, eagerly anticipated is the development of a circularly polarizing plate including a λ/4 retardation film fabricated by high-rate stretching, and an organic electroluminescent display device including the circularly polarizing plate, which are excellent in the stability of color tone, the stability of size, the resistance to the warpage due to the curved film, and the prevention of the reflection of external light, especially after the long-term storage in a high-temperature high-humidity environment.

PRIOR ART DOCUMENTS

Patent Documents

Patent Document 1: Japanese Unexamined Patent Application Publication No. H1-2722
Patent Document 2: Japanese Unexamined Patent Application Publication No. H11-52133
Patent Document 3: Japanese Unexamined Patent Application Publication No. 2008-165199

SUMMARY OF INVENTION

Technical Problem

An object of the invention, which has been accomplished in view of the above problems, is to provide a circularly polarizing plate and an organic electroluminescent display device including the circularly polarizing plate, which are excellent in the visibility, the durability (against unevenness in images), and the resistance to deterioration (flatness), after the long-term storage in a high-temperature high-humidity environment.

Means to Solve Problems

The inventors, who have diligently studied to solve the problems described above, have found that an organic electroluminescent display device including a protective film, a polarizer, a λ/4 retardation film, and an organic electroluminescent element in sequence from a viewer side, at least one face of the λ/4 retardation film being provided with a layer A having a storage elastic modulus in a range of 100 to 500 MPa exhibits superior visibility, durability (against unevenness in images) and durability against deterioration of the panel (flatness) after long-term storage under high-temperature high-humidity environments.

In specific, the problems described above are solved by the following aspects.

Aspect 1. An organic electroluminescent display device including a protective film, a polarizer, a λ/4 retardation film, and an organic electroluminescent element in sequence from a viewer side, at least one face of the λ/4 retardation film being provided with a layer A having a storage elastic modulus in a range of 100 to 500 MPa.

Aspect 2. The organic electroluminescent display device of aspect 1, wherein the protective film and the λ/4 retardation film provided with the layer A have a difference in size variation rate C in a range of 0.1 to 10.0%, the difference being defined by Expression (1):

$$\text{Difference in size variation rate } C = |\{(Lp(80°C.) - Lp(20°C.))/Lp(20°C.)\} \times 100| - |\{(Lq(80°C.) - Lq(20°C.))/Lq(20°C.)\} \times 100|(\%) \quad \text{Expression (1)}$$

where Lp(20° C.) is a reference size of the protective film at 20° C., Lp(80° C.) is a size of the protective film of Lp(20° C.) at 80° C., Lq(20° C.) is a reference size of the λ/4 retardation film provided with the layer A at 20° C., and Lq(80° C.) is a size of the λ/4 retardation film provided with the layer A of Lq(20° C.) at 80° C.

Aspect 3. The organic electroluminescent display device of aspect 1 or 2, wherein the layer A is disposed between the polarizer and the λ/4 retardation film, a layer B is disposed between the protective film and the polarizer, the storage elastic modulus A of the layer A is greater than the storage elastic modulus B of the layer B.

Aspect 4. The organic electroluminescent display device of any one of aspects 1 to 3, wherein the layer A has an absorption maximum in a wavelength range of 200 to 400 nm.

Aspect 5. The organic electroluminescent display device of any one of aspects 1 to 4, wherein the layer A contains a uv curable resin.

Aspect 6. A circularly polarizing plate including a protective film, a polarizer, and a λ/4 retardation film in sequence, at least one face of the λ/4 retardation film being provided with a layer A having a storage elastic modulus in a range of 100 to 500 MPa.

Aspect 7. The circularly polarizing plate of aspect 6, wherein the protective film and the λ/4 retardation film provided with the layer A have a difference in size variation rate C in a range of 0.1 to 10.0%, the difference being defined by Expression (1):

$$\text{Difference in size variation rate } C = |\{(Lp(80°C.) - Lp(20°C.))/Lp(20°C.)\} \times 100| - |\{(Lq(80°C.) - Lq(20°C.))/Lq(20°C.)\} \times 100|(\%) \quad \text{Expression (1)}$$

where Lp(20° C.) is a reference size of the protective film at 20° C., Lp(80° C.) is a size of the protective film of Lp(20° C.) at 80° C., Lq(20° C.) is a reference size of the λ/4 retardation film provided with the layer A at 20° C., and Lq(80° C.) is a size of the λ/4 retardation film provided with the layer A of Lq(20° C.) at 80° C.

Aspect 8. The circularly polarizing plate of aspect 6 or 7, wherein the layer A is disposed between the polarizer and the λ/4 retardation film, a layer B is disposed between the protective film and the polarizer, the storage elastic modulus A of the layer A is greater than the storage elastic modulus B of the layer B.

Aspect 9. The circularly polarizing plate of any one of aspects 6 to 8, wherein the layer A has an absorption maximum in a wavelength range of 200 to 400 nm.

Aspect 10. The circularly polarizing plate of any one of aspects 6 to 9, wherein the layer A contains a uv curable resin.

Advantageous Effects of Invention

The invention can provide a circularly polarizing plate including a λ/4 retardation film, and an organic electroluminescent display device including the circularly polarizing plate, which are excellent in the visibility, the durability (against unevenness in images), and the resistance to the deterioration (flatness), after the long-term storage in a high-temperature high-humidity environment.

BRIEF DESCRIPTION OF DRAWINGS

FIG. 5C is a schematic diagram illustrating another example process (for unrolling an original long film from a roll and diagonally stretching the film) according to the embodiment of the invention.

DESCRIPTION OF EMBODIMENTS

Figure 1:
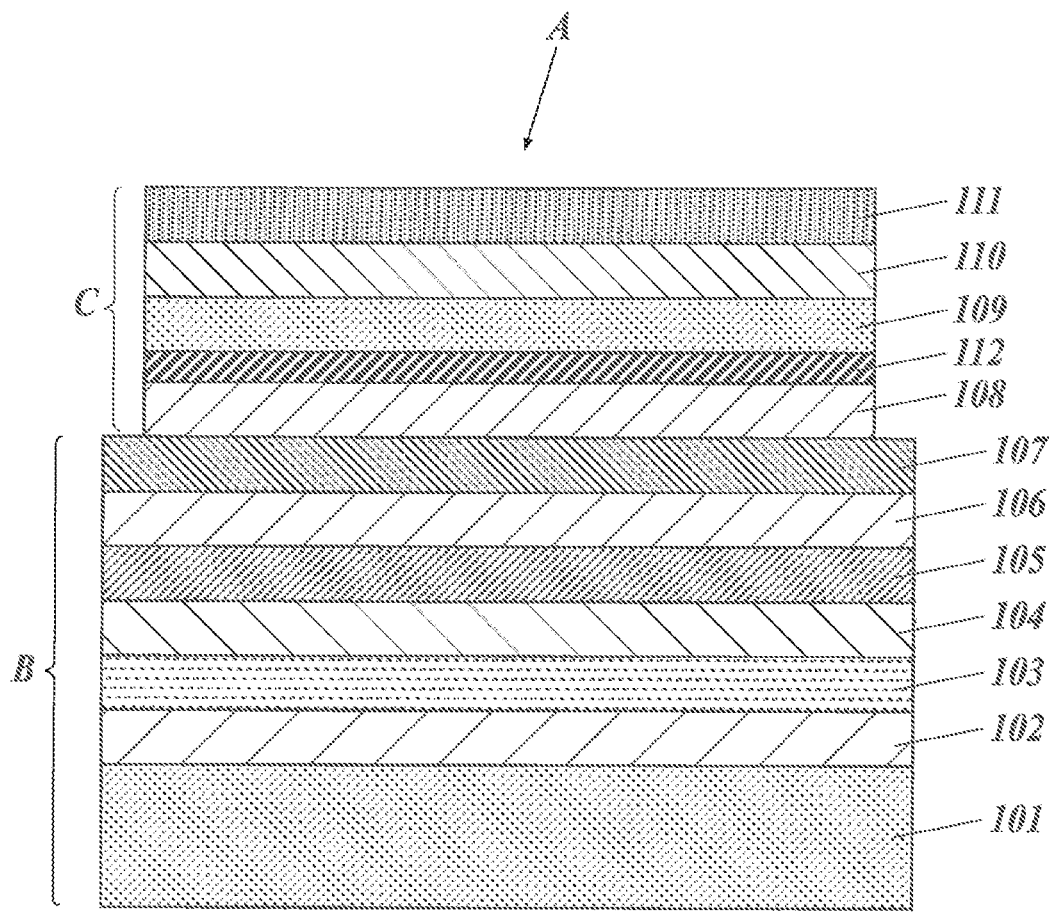
FIG. 1 is a schematic cross-sectional view illustrating an example configuration of an organic electroluminescent display device according to the invention.

An organic electroluminescent display device of the present invention includes a protective film, a polarizer, a λ/4 retardation film, and an organic electroluminescent element in sequence from a viewer side, and at least one face of the λ/4 retardation film is provided with a layer A having a storage elastic modulus in a range of 100 to 500 MPa. Such a technical feature is common to the invention according to Aspects 1 to 5. A circularly polarizing plate of the present invention includes a protective film, a polarizer, and λ/4 retardation film in sequence, and at least one face of the λ/4 retardation film is provided with a layer A having a storage elastic modulus in a range of 100 to 500 MPa. Such a technical feature is common to the invention according to Aspects 6 to 10.

Embodiments of the invention will now be described in detail.

The organic electroluminescent display device (organic EL display device) of Aspect 1 of the invention or the circularly polarizing plate of Aspect 6 includes a protective film, a polarizer, and a λ/4 retardation film in sequence from a viewer side, and at least one face of the λ/4 retardation film is provided with a layer A having a storage elastic modulus in a range of 100 to 500 MPa. Thus, the invention provides a circularly polarizing plate provided with a λ/4 retardation film, and an organic electroluminescent display device including the circularly polarizing plate which exhibits superior visibility, durability (against unevenness in images), and durability against deterioration of the panel (flatness) after long-term storage under high-temperature high-humidity environments.

Such a configuration of the present invention solves the problems for the following reasons.

An organic electroluminescent display device includes a protective film, a polarizer, a λ/4 retardation film, and an organic electroluminescent element in sequence from a viewer side, and at least one face of the λ/4 retardation film is provided with a layer A having a storage elastic modulus in a range of 100 to 500 MPa. This reduces the amount of change in size of the λ/4 retardation film or retardation dependent on environments. This allows for an organic electroluminescent display device including a circularly polarizing plate provided with a λ/4 retardation film, the circularly polarizing plate exhibiting a small change in color, the display device having a low level of panel warpage, superior visibility (resistance to external light reflection), and uv resistance even after long-term storage under high-temperature high-humidity environments.

According to the invention of Aspects 2 and 7, the protective film and the λ/4 retardation film including the layer A have a difference in size variation rate C in a range of 0.1 to 10.0%.

The protective film and the λ/4 retardation film including the layer A have a difference in size variation rate C in such a range. Thus, the difference in size variation rate is small between the protective film forming the circularly polarizing plate and the λ/4 retardation film including the layer A, which stabilizes the flatness (the curve characteristic) after long-term storage under high-temperature high-humidity environments.

According to the invention of Aspects 3 and 8, the layer A is disposed between the polarizer and the λ/4 retardation film, a layer B is disposed between the protective film and the polarizer, and the storage elastic modulus A of the layer A is greater than the storage elastic modulus B of the layer B.

In the layers A and B having different storage elastic moduli are disposed in predetermined positions in the circularly polarizing plate, the stress can be reduced between the component layers, and noticeable warpage of the panel can be reduced.

According to the invention of Aspects 4 and 9, the layer A has an absorption maximum in a wavelength range (uv range) of 200 to 400 nm.

The layer A exhibiting such a uv absorption can reduce undesirable uv light entering the organic electroluminescent element from a viewer side, resulting in superior resistance to light.

According to the invention of Aspects 5 and 10, the layer A contains at least one uv curable resin.

The Layer A containing a uv curable resin has a desirable storage elastic modulus.

<<Organic Electroluminescent Display Device>>

The configuration of the organic electroluminescent display device according to the invention will now be described in brief.

FIG. 1 is a schematic cross-sectional view illustrating an example configuration of an organic electroluminescent display device according to the invention.

An organic EL display device A includes an organic EL element B including a substrate 101 composed of glass or polyimide, a metal electrode 102, an organic luminescent layer 103, a transparent electrode (e.g., ITO) 104, an insulating layer 105, a sealing layer 106, and a film 107 (optional); and a circularly polarizing plate C including a λ/4 retardation film 108, a polarizer 109, and a protective film (also referred to as "polarizing-plate protective film") 110, in sequence, as illustrated in FIG. 1. The protective film 110 may be further provided with a surface antireflective layer 112 thereon. The thickness of the organic EL element B, excluding the substrate 101, is approximately 1 μm.

The circularly polarizing plate C according to the invention further includes a layer A (112) having a storage elastic modulus of 100 to 500 MPa on at least one face of the λ/4 retardation film 108. It is preferred that the layer A (112) be disposed between the polarizer 109 and the λ/4 retardation film 108, as illustrated in FIG. 1. It is also preferred that the layer A (112) according to the invention have λmax in the uv wavelength range of 200 to 400 nm.

It is also preferred that a layer B be further disposed between the protective film 110 and the polarizer 109 to relax the stress in the layers of the circularly polarizing plate according to the invention.

Figure 2:
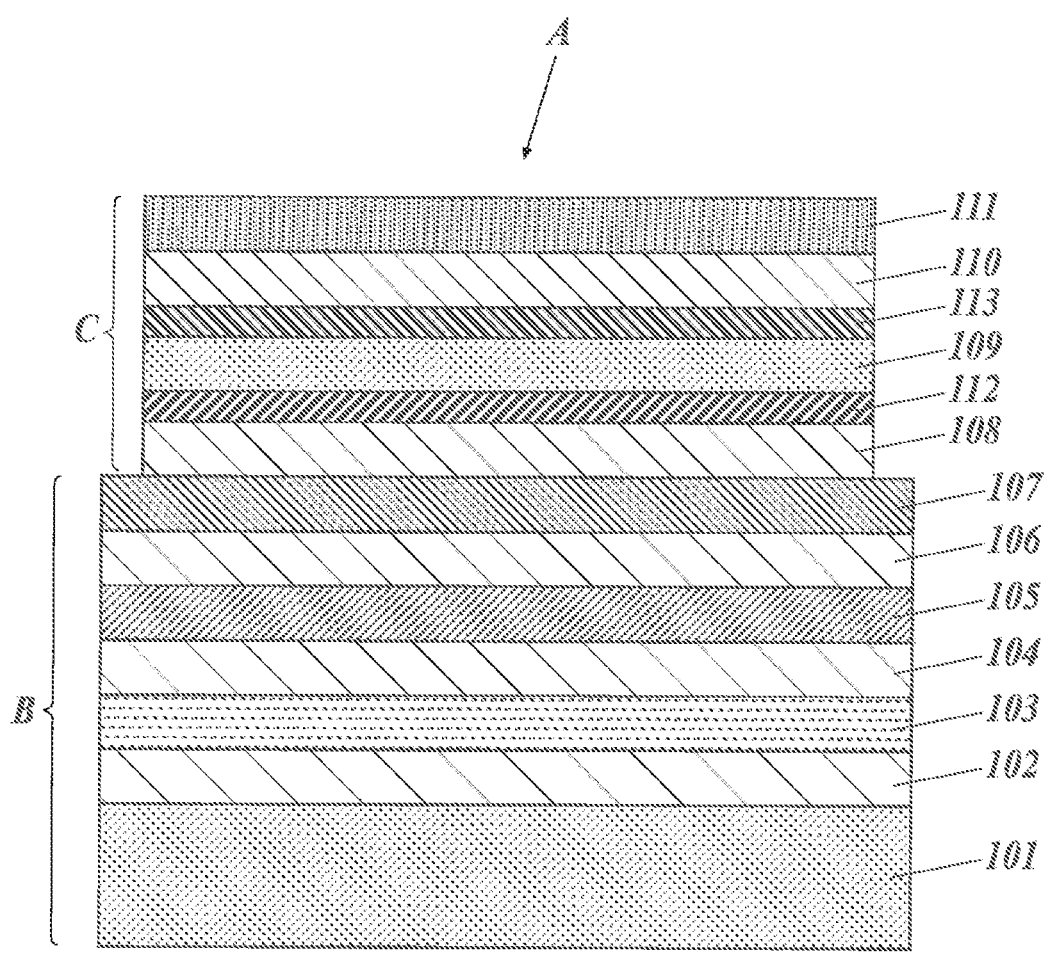
FIG. 2 is a schematic cross-sectional view illustrating another example configuration of an organic electroluminescent display device according to the invention.

FIG. 2 illustrates another example configuration of an organic electroluminescent display device according to the invention, which includes the layer A (112) and the layer B (113). In specific, in the circularly polarizing plate C, the layer A (112) is disposed between the polarizer 109 and the λ/4 retardation film 108, and the layer B (113) is disposed between the protective film 110 and the polarizer 109. In this configuration, it is preferred that the storage elastic modulus of the layer A (112) (storage elastic modulus A) be greater than that of the layer B (113) (storage elastic modulus B) to effectively relax the stress in the layers.

In a typical organic EL display device, a luminescent element (organic EL element) includes a transparent substrate, a metal electrode, an organic luminescent layer, and a transparent electrode, which are laminated in sequence. The organic luminescent layer consists of any combination of various organic thin films, such as a laminate of a hole injecting layer composed of a triphenylamine derivative and a luminescent layer composed of a fluorescent organic solid such as anthracene, a laminate of the luminescent layer and an electron injecting layer composed of a perylene derivative, or a laminate of the hole injecting layer, the luminescent layer, and the electron injecting layer. The individual constituents of the organic EL element will now be described in detail.

The transparent electrode and the metal electrode inject holes and electrons into the organic luminescent layer in response to the application of voltage. The holes recombine with the electrons and generate energy, which excites a fluorescent substance. The excited fluorescent substance emits light while returning to the ground state, so that the organic EL display device emits light. The mechanism of the recombination is identical to that in general diodes. This fact indicates that the current and the luminescent intensity show strong nonlinearity and rectification with respect to the applied voltage.

An organic EL display device should include at least one transparent electrode that transmits light from the organic luminescent layer, and typically includes a transparent anode composed of a transparent conductor such as indium tin oxide (ITO). The cathode should contain a material having a low work function to facilitate the electron injection and increase the luminous efficiency, and typically contains a metal such as Mg—Ag or Al—Li.

In such an organic EL display device, the organic luminescent layer consists of significantly thin films having a thickness of approximately 10 nm, and therefore transmits substantially all the light like the transparent electrode. In the non-luminescent mode, the light incident from the face of the transparent substrate and passing through the transparent electrode and the organic luminescent layer is reflected by the metal electrode toward the face of the transparent substrate, so that the screen of the organic EL display device appears specular from the exterior.

The organic EL display device, which includes an organic EL element including a transparent electrode, an organic luminescent layer to emit light in response to the application of voltage, and a metal electrode, in sequence from a viewer side, may be further provided with a polarizing plate on the surface (the viewer side) of the transparent electrode, and a retardation plate between the transparent electrode and the polarizing plate.

The retardation plate and the polarizing plate polarize the external light reflected by the metal electrode, so that the metal electrode does not appear specular from the exterior. In particular, in the invention, the retardation plate is a λ/4 retardation film and the angle defined by the direction of polarization of the polarizing plate and the direction of polarization of the retardation plate is π/4, which configuration can completely shield the specular surface of the metal electrode.

The polarizing plate allows transmission of only the linearly polarized light component of the light incident on the organic EL display device. The linearly polarized light typically is converted into elliptically polarized light by a retardation plate. In the invention, the retardation plate is a λ/4 retardation film and the angle defined by the direction of polarization of the polarizing plate and the direction of polarization of the retardation plate is π/4, which configuration converts the linearly polarized light into circularly polarized light.

The circularly polarized light passes through the transparent substrate, the transparent electrode, and the organic thin film; is reflected by the metal electrode; passes through the organic thin film, the transparent electrode, and the transparent substrate again; and is converted into linearly polarized light in the retardation plate. The linearly polarized light having a polarization direction orthogonal to the polarization direction of the polarizing plate cannot pass through the polarizing plate. This configuration can completely shield the specular surface of the metal electrode.

<<Configuration of Circularly Polarizing Plate>>

The individual constituents of the circularly polarizing plate according to the invention will now be described in detail.

[Circularly Polarizing Plate]

The circularly polarizing plate according to the invention at least includes a protective film, a polarizer, and a λ/4 retardation film in sequence. At least one face of the λ/4 retardation film is provided with a layer A having a storage elastic modulus of 100 to 500 MPa. The circularly polarizing plate in the organic EL display device can prevent the specular reflection by the metal electrode of the organic EL element.

It is preferred that the circularly polarizing plate according to the invention be a long plate fabricated by the roll-to-roll lamination of a long λ/4 retardation film, which is stretched in a diagonal direction such that the angle of the slow axis (i.e., alignment angle θ) is "substantially 45°" from the longitudinal direction.

It is preferred that the circularly polarizing plate according to the invention have uv absorptivity to prevent the organic EL display device from deteriorating due to uv rays. In specific, the uv absorptivity should preferably be provided to the protective film on the viewer side to protect both the polarizer and the organic EL element from uv rays, and more preferably provided to the layer A according to the invention to further prevent the deterioration of the organic EL element.

The circularly polarizing plate according to the invention may include the λ/4 retardation film, the stretched poly(vinyl alcohol) doped with iodine or a dichromatic dye as the polarizer, and the protective film, in sequence.

The circularly polarizing plate according to the invention may be further provided with a protective sheet on one face and a separable sheet on the other face. The protective and separable sheets can protect the circularly polarizing plate during its shipment and inspection.

[Difference in Size Variation Rate C]

In the circularly polarizing plate according to the invention, the difference in size variation rate C (%), which is determined from Expression (1), between the protective film and the λ/4 retardation film provided with the layer A (which are described below), is preferably 0.1 to 10.0%.

Difference in size variation rate $C=|\{(Lp(80°\ C.)-Lp(20°\ C.))/Lp(20°\ C.)\}\times 100|-|\{(Lq(80°\ C.)-Lq(20°\ C.))/Lq(20°\ C.)\}\times 100|(\%)$  Expression (1)

where Lp(20° C.) is a reference size of the protective film at 20° C., Lp(80° C.) is a size of the protective film of Lp(20° C.) at 80° C., Lq(20° C.) is a reference size of the λ/4 retardation film provided with the layer A at 20° C., and Lq(80° C.) is a size of the λ/4 retardation film provided with the layer A of Lq(20° C.) at 80° C.

In specific, the difference is determined through the following process.

The single protective film is conditioned at a temperature of 20° C. and a relative humidity of 55% for 24 hours, and is marked with a cutter at intervals of approximately 10 cm in both the width and longitudinal directions; then each of the lengths Lp(20° C.) between the marks is accurately measured. The protective film is then placed at a temperature of 80° C. and a relative humidity of 55% for 24 hours, and each of the lengths Lp(80° C.) between the marks is accurately measured. The size variation rate (absolute value) A of the protective film is determined from Expression (2).

Size variation rate $A$ of protective film $=|\{(Lp(80°\ C.)-Lp(20°\ C.))/Lp(20°\ C.)\}\times 100|(\%)$  Expression (2)

For the λ/4 retardation film provided with the layer A, the reference length Lq(20° C.) after the conditioning at a temperature of 20° C. and a relative humidity of 55% for 24 hours, and the length Lq(80° C.) after the storage at a temperature of 80° C. and a relative humidity of 55% for 24 hours are also accurately measured as in the protective film. The size variation rate (absolute value) B of the λ/4 retardation film provided with the layer A is determined from Expression (3).

Size variation rate $B$ of λ/4 retardation film with layer $A=|\{(Lq(80°\ C.)-Lq(20°\ C.))/Lq(20°\ C.)\}\times 100|(\%)$  Expression (3)

The difference in size variation rate C (%) is calculated from Expression (1) using the size variation rate A of the protective film and the size variation rate B of the λ/4 retardation film provided with the layer A.

The difference in size variation rate C between the protective film and the λ/4 retardation film provided with the layer A in the circularly polarizing plate according to the invention (i.e., after the storage in a high-temperature environment) is reduced to 0.1 to 10.0%, so as to reduce the warpage of the panel and the deterioration in the flatness of the λ/4 retardation film due to its shrinkage. This configuration can prevent the reflection of external light (the visibility) even after long-term exposure to a high-temperature high-humidity environment.

The difference in size variation rate C between the protective film and the λ/4 retardation film provided with the layer A according to the invention, is adjusted to 0.1 to 10.0% by the selection of a composition of the protective film, the selection of a composition of the λ/4 retardation film, the optimization of the storage elastic modulus of the layer A on the λ/4 retardation film to reduce the difference in size variation rate between the employed films, or any other means.

[Protective Film]

Examples of the material for forming a protective film (110 in FIG. 1) of the present invention include cellulose ester films, such as films of triacetyl cellulose, cellulose acetate propionate, cellulose diacetate, and cellulose acetate butyrate; films of polyesters, such as polyethylene terephthalate and polyethylene naphthalate; films of polycarbonates, polyarylates, polysulfone (including polyether sulfons), polyethylene, polypropylen, cellophane, polyvinylidene chloride, polyvinyl alcohol, ethylene vinyl alcohol, syndiotactic polystyrene, norbornene resins, polymethylpentene, polyether ketones, polyether ketone imides, polyamides, fluorinated resins, nylons, cycloolefin polymers, polymethyl methacrylate, and acrylates.

Among these films, preferred are cellulose esters films (such as Konica Minolta Tac KC8UX, KC4UX, KCSUX, KC8UCR3, KC8UCR4, KC8UCR5, KC8UY, KC4UY, KC4UE, KC4UA, KC6UA, and KC12UR (available from Konica Minolta Advanced Layers, Inc.), polycarbonate films, cycloolefin polymer films, and polyester films. In the present invention, cellulose ester films are particularly preferred in view of optical characteristics, productivity, and material cost.

In an organic EL display device for displaying 3D (stereoscopic) images, λ/4 retardation films disposed on both faces of the polarizer can improve the quality of displayed images; hence, the protective film may preferably be replaced with the λ/4 retardation film according to the invention. It is preferred that the direction achieving the maximum elastic modulus in the protective film be tilted by 35° to 55° from the longitudinal direction of the screen of the display device and be parallel to the direction achieving the maximum elastic modules in the λ/4 retardation film. This configuration can achieve a high-definition organic electroluminescent display device for displaying 3D images without the warpage of the panel.

[Polarizer]

The polarizer 109 in the organic EL display device of the invention in FIG. 1 may be of any appropriate type, e.g. a uniaxially stretched film of a hydrophilic polymer, such as polyvinyl alcohol, a partially formalized polyvinyl alcohol, or a partially saponified ethylene-vinyl acetate copolymer, onto which a dichroic material, such as iodine or a dichroic dye, is adsorbed; or a polyene-based alignment film, such as dehydrated polyvinyl alcohol or a dehydrochlorinated polyvinyl chloride. Among these, a uniaxially stretched polyvinyl alcohol film onto which a dichroic material, such as iodine, is adsorbed is preferred as a polarizer for its high circular dichroism. The polarizer has any thickness, usually about 1 to 80 μm.

A polarizer of a uniaxially stretched polyvinyl alcohol film onto which iodine is adsorbed can be prepared, for example, by dipping polyvinyl alcohol in an aqueous iodine solution for staining and then stretching the film to 3 to 7 times its original length. The solution may contain boric acid, zinc sulfate, zinc chloride, as required or may be an aqueous potassium iodide solution. The polyvinyl alcohol-based film may be dipped in water for washing before the staining.

Washing the polyvinyl alcohol film with water advantageously removes soils or antiblocking agent on the surface of the polyvinyl alcohol film and swells the polyvinyl alcohol film to inhibit unevenness, for example, irregular staining. The film may be stretched after, during, or before staining with iodine. The film may be stretched in an aqueous boric acid or potassium iodide solution or in a water bath.

[λ/4 Retardation Film]

The λ/4 retardation film in the circularly polarizing plate according to the invention will now be described in detail.

The λ/4 retardation film can convert linearly polarized light having a certain wavelength into circularly polarized light (or circularly polarized light into linearly polarized light). The in-plane retardation Ro of the λ/4 retardation film at a predetermined light wavelength (typically in the visible light range) is approximately one-quarter the wavelength.

It is preferred that the λ/4 retardation film according to the invention have an in-plane retardation Ro(450) of 100 to 130 nm at a light wavelength of 450 nm under a temperature of 23° C. and a relative humidity of 55%, an in-plane retardation Ro(550) of 130 to 160 nm at a light wavelength of 550 nm, and an in-plane retardation Ro(650) of 155 to 175 nm at a light wavelength of 650 nm.

It is preferred that the λ/4 retardation film according to the invention provide all the light in the visible-light wavelength range with a retardation of one-quarter the wavelength, i.e., the λ/4 retardation film have the reverse wavelength dispersion (Ro(450)<Ro(550)<Ro(650)). Although the λ/4 retardation film having the normal wavelength dispersion can also achieve the retardation λ/4 together with a λ/2 plate laminated thereon, such a multi-layer configuration increases the thickness retardation (Rt) and leads to decreased visibility due to the axial deviation.

Regarding the wavelength dispersion of the λ/4 retardation film, the ratio of the retardation Ro(450) to the retardation Ro(650) is lower than 1.00, preferably not higher than 0.97, and more preferably not higher than 0.95. It is particularly preferred that the retardation be λ/4 in the highly visible range from green to red, and that the ratio of the retardation Ro(550) to the retardation Ro(650) be 0.80 to 0.90.

The retardation Ro(550) according to the invention is calculated from Expression (i).

$$Ro = (n_x - n_y) \times d \quad \text{Expression (i)}$$

where $n_x$ is a refractive index in the slow-axis direction x in the film, $n_y$ is a refractive index in the direction y perpendicular to the direction x in the film, and d is the thickness of the film (nm). The refractive indexes are measured at a wavelength of 550 nm under a temperature of 23° C. and a relative humidity of 55%.

The retardation Ro(650) is also calculated from Expression (i) based on a wavelength of 650 nm.

The retardation Ro according to the invention may be calculated based on the birefringence indexes measured with, for example, an automatic birefringence analyzer KOBRA-21ADH (made by Oji Scientific Instruments), at a wavelength of 550 or 650 nm under a temperature of 23° C. and a relative humidity of 55%.

The circularly polarizing plate is fabricated such that the slow axis of the λ/4 retardation film is tilted by substantially 45° from the transmission axis of the polarizer. In specific, the original long film for the λ/4 retardation film, which has a slow-axis angle (i.e., alignment angle θ) of substantially 450 from its longitudinal direction, is laminated on the long film for the polarizer, which has a transmission axis or absorption axis parallel to its longitudinal direction, such that their longitudinal directions are parallel to each other. This technique can efficiently fabricate a long film for the circularly polarizing plate.

It is therefore preferred that the original film for the λ/4 retardation film according to the invention have an alignment angle θ of substantially 45° from the longitudinal direction. The phrase "substantially 45°" in the invention preferably refers to the range of 35° to 55° from the longitudinal direction.

In specific, the alignment angle θ of the λ/4 retardation film according to the invention is preferably 40° to 50°, more preferably 42° to 48°, even more preferably 43° to 47°, and most preferably 44° to 46°.

(Component of λ/4 Retardation Film)

The λ/4 retardation film according to the invention shows high retardation even if the film is finished into a smaller thickness, has high visibility and durability, and is suitable for the saponification after the long-term storage in a high-temperature high-humidity environment, in spite of the diagonal stretching.

The λ/4 retardation film of the invention may be made of any resin, preferably a cellulose resin (e.g., cellulose acetate or cellulose acylate resin), polycarbonate resin, or cycloolefin resin.

<Cellulose Resin>

A cellulose resin applicable to the present invention is cellulose acetate which preferably has an average degree of substitution of acetyl group of 2.00 or more, more preferably in a range of 2.00 to 2.95, more preferably in a range of 2.20 to 2.90. The average degree of substitution of acetyl group indicates the average number of esterified (acetylated) hydroxyl groups among three hydroxyl groups contained in each anhydroglucose in the cellulose, and is in a range of 0 to 3.0.

An average degree of substitution of acetyl group in cellulose acetate of below 2.0 leads to high dope viscosity that may result in low quality of the film surface and an increase in haze due to inevitable high stretching tension.

In the present invention, the site not replaced with an acetyl group is usually a hydroxyl group. These resins can be synthesized by a known process.

The degree of substitution of acetyl group is determined by a method in accordance with ASTM-D817-96 (a method for testing cellulose acetate and other materials).

The number average molecular weight (Mn) of cellulose acetate of the invention is preferably in a range of 30,000 to 300,000, more preferably in a range of 50,000 to 200,000 to enhance the mechanical strength of the film.

The ratio of the weight average molecular weight (Mw) of the cellulose acetate to the number average molecular weight (Mn) of the cellulose acetate (Mw/Mn) is preferably in a range of 1.4 to 3.0.

The weight average molecular weight (Mw) and the number average molecular weight (Mn) of the cellulose acetate can be determined by gel permeation chromatography (GPC).

Example conditions in gel permeation chromatography (GPC) are as follows:

Solvent: methylene chloride

Column: Shodex K806, K805, and K803G (available from Showa Denko, connected in series)

Column temperature: 25° C.

Sample concentration: 0.1 mass %

Detector: RI Model 504 (GL Sciences)

Pump: L6000 (Hitachi, Ltd.)

Flow rate: 1.0 ml/min

Calibration curve: the calibration curve was determined with 13 samples (STK standard polystyrene (TOSOH CORPORATION)) each having a Mw of 1000000 to 500. The ranges between the MWs are substantially identical.

In the present invention, examples of the material for preparation of the cellulose acetate include any cellulose, e.g., cotton linter, wood pulp, and kenaf. The cellulose esters prepared with these materials may be used in combination at any proportion.

The cellulose acetate of the present invention may be prepared by a known process. In general, a cellulose, a predetermined organic acid (e.g. acetic acid), an acid anhydride (e.g. acetic anhydride), a catalyst (e.g. sulfuric acid) are mixed to esterify and acetylate the cellulose. The reaction is continued until the generation of cellulose triester (acetylation). In the trimester (after acetylation), three hydroxyl groups in the glucose unit are replaced with acetyl groups in the organic acid. The cellulose triester is hydrolyzed for the synthesis of a cellulose acetate having a preferred degree of substitution of acetyl group. The mixture is then subjected to filtration, precipitation, water washing, dewatering, drying and any other required step. A cellulose acetate is thereby prepared.

In particular, the cellulose acetate can be prepared by the process disclosed in Japanese Unexamined Patent Application Publication No. H10-45804.

The λ/4 retardation film of the present invention exhibits high retardation; hence, the film can be thin and the draw ratio can be reduced even if high retardation is required. Such a low draw ratio can avoid defects such as break of the film. In a preferred embodiment, the film can therefore be made of cellulose acylate having an average degree of substitution of the total acyl group in a range of 1.00 to 3.00.

For compatibility between adequate moisture permeability and hydrophobicity, the average degree of substitution of an acyl group having a carbon number of three or more is preferably in a range of 0.90 to 2.50.

In the present invention, the degree of substitution of acyl group may be determined in accordance with ASTM D-817-91. The average degree of substitution of the total acyl group is preferably in a range of 1.00 to 3.00, more preferably 2.00 to 2.90, most preferably 2.40 to 2.75. The average degree of substitution of an acyl group having a carbon number of three or more is preferably in a range of 0.50 to 2.50, more preferably 0.80 to 2.00, most preferably 1.00 to 1.70.

If the cellulose acylate has a degree of substitution of the total acyl group of 1.00 or more, alkaline saponification in the process for fabricating the circularly polarizing plate does not damage the film, allowing the film to serve as a protective film. The degree of substitution of the total acyl group of the cellulose acylate is not more than 3.00 due to its chemical structure.

If the cellulose acylate has a degree of substitution of an acyl group with a carbon number of 3 or more of 0.90 or more, the λ/4 film has hydrophobicity and the organic EL element of the invention has higher durability. If the cellulose acylate has a degree of substitution of an acyl group with a carbon number of 3 or more of 2.50 or less, the film sufficiently adheres to the polarizer, facilitating the fabrication of the polarizing plate.

Such an acyl group with a carbon number of three or more is preferably a propionyl group suitable for saponification.

The cellulose acylate preferably has a number average molecular weight (Mn) in a range of 30000 to 300000, more preferably 50000 to 200000 to enhance the mechanical strength of the resulting film.

The ratio of the weight average molecular weight (Mw) of the cellulose acylate to the number average molecular weight (Mn) of the cellulose acylate (Mw/Mn) is preferably in a range of 1.4 to 3.0.

The weight average molecular weight (Mw) and the number average molecular weight (Mn) of the cellulose acetate can be determined by gel permeation chromatography (GPC).

The cellulose acylate of the invention can be prepared by acylation of the cellulose. If the acylating agent is an acid anhydride (e.g. acetic anhydride, propionic anhydride, or butyric anhydride), the synthesis is carried out with an organic acid, such as acetic acid, or an organic solvent, such as methylene chloride, and a protic catalyst, such as sulfuric acid. If the acylating agent is an acid chloride (e.g., $CH_3COCl$, $C_2H_5COCl$, or $C_3H_7COCl$), a basic compound, such as amine, is used as a catalyst for the reaction.

A cellulose acylate applicable to the present invention can be prepared by a known process, such as a process disclosed in Japanese Unexamined Patent Application Publication No. H10-45804.

A cellulose ester applicable to the λ/4 retardation film of the invention is a carboxylic acid ester or aromatic carboxylic acid ester with a carbon number of about 2 to 22, preferably a short-chain fatty acid ester with a carbon number of 6 or less.

A straight-chain, branched-chain, or cyclic acyl group may be bonded to the hydroxyl group. Alternatively, another substituent may be used. At the same degree of substitution, a larger carbon number results in lower birefringence. A preferred acyl group therefore has a carbon number of 2 to 6. The cellulose ester preferably has a carbon number of 2 to 4, more preferably 2 to 3.

Examples of the cellulose ester include mixed fatty acid esters of cellulose containing an acetyl group bonded to a propionate group, a butyrate group, or a phthaloyl group, such as cellulose acetate propionate, cellulose acetate butyrate, cellulose acetate propionate butyrate, and cellulose acetate phthalate. The butyrate is composed of a straight-chain or branched-chain butyril group.

Preferred cellulose esters in the present invention are cellulose acetate, cellulose acetate butyrate, and cellulose acetate propionate. Among these, cellulose acetate propiolate is most preferred.

A preferred cellulose ester has a degree of substitution of the total acyl group in a range of 2.0 to 2.9 that satisfies Expressions (1) and (2).

$$2.0 \leq X+Y \leq 2.9 \quad \text{Expression (1)}$$

$$0 \leq Y \leq 1.5 \quad \text{Expression (2)}$$

where X is a degree of substitution of acetyl group and Y is a degree of substitution of a propionyl group, a butyril group, or a composition thereof. The degree of substitution of an acetyl group or other acyl groups can be determined in accordance with ASTM-D817-96.

For desirable optical characteristics, a composition of resins having different degrees of substitution may be used. The mass ratio in a binary mixture should preferably be in a range of 10:90 to 90:10.

Among them, cellulose acetate propionate is most preferred. Preferred cellulose acetate propionate satisfies (1.0≤X≤2.5), (0.1≤Y≤2.0), and (2.0≤X+Y≤2.9).

The number average molecular weight of the cellulose ester in the invention is preferably in a range of 60000 to 300000, more preferably in a range of 70000 to 200000 to enhance the mechanical strength of the resulting film.

The weight average molecular weight (Mw) and the number average molecular weight (Mn) of the cellulose ester can be determined by gel permeation chromatography (GPC).

The cellulose ester can be prepared by a known process, such as a process disclosed in Japanese Unexamined Patent Application Publication No. H10-45804.

<Polycarbonate Resin>

A preferred polycarbonate resin for the λ/4 retardation film of the invention is an aromatic polycarbonate prepared by the reaction of an aromatic dihydric phenol and a carbonate precursor.

The present invention may use any aromatic polycarbonate that allows the film to have desired characteristics. Polymeric materials, usually called polycarbonates, are prepared by polycondensation reaction and have main chains linked by a carbonate bond. Polymeric materials especially refer to those prepared by the polycondensation of a phenol derivative, phosgene, and diphenyl carbonate. An aromatic polycarbonate having repeating units and containing a bisphenol component of 2,2-bis(4-hydroxyphenyl) propane, generally called bisphenol A is preferably used. An aromatic polycarbonate copolymer of the invention may be prepared with any appropriate bisphenol derivative.

Examples of the comonomer components other than bisphenol A include bis(4-hydroxyphenyl)methane, 1,1-bis(4-hydroxyphenyl)cyclohexane, 9,9-bis(4-hydroxyphenyl)fluorene, 1,1-bis(4-hydroxyphenyl)-3,3,5-trimethylcyclohexane, 2,2-bis(4-hydroxy-3-methylphenyl)propane, 2,2-bis(4-hydroxyphenyl) 2-phenylethane, 2,2-bis(4-hydroxyphenyl) 1,1,1,3,3,3-hexafluoropropane, bis(4-hydroxyphenyl))diphenylmethane, bis(4-hydroxyphenyl) sulfide, bis(4-hydroxyphenyl)sulfone, and 1,1-bis(4-hydroxyphenyl)-3,3,5-trimethylcyclohexane.

An aromatic polyester carbonate containing terephthalic acid or isophthalic acid component may be partly used. An aromatic polycarbonate of bisphenol A containing such a unit, which has high heat-resistance, solubility, and other desired properties, may be used in the present invention.

The viscosity average molecular weight of the aromatic polycarbonate of the invention is preferably in a range of 10000 to 200000, more preferably 20000 to 120000. A film of a resin with a viscosity average molecular weight of 10000 or more has satisfactory mechanical strength. A resin with a viscosity average molecular weight of 200000 or less prevents excessively high viscosity of the dopant, and thus can readily be treated. The viscosity average molecular weight can be measured by a commercially available high performance liquid chromatograph, for example.

Alternatively, the invention may use any of the polycarbonate resins disclosed in the following documents: Japanese Unexamined Patent Publication No. 2006-131660, Japanese Unexamined Patent Publication No. 2006-143832, Japanese Unexamined Patent Publication No. 2006-232897, Japanese Unexamined Patent Publication No. 2008-163107, Japanese Unexamined Patent Publication No. 2008-222965, Japanese Unexamined Patent Publication No. 2008-285638, Japanese Unexamined Patent Publication No. 2010-134232, Japanese Unexamined Patent Publication No. 2010-241883, Japanese Unexamined Patent Publication No. 2010-261008, Japanese Unexamined Patent Publication No. 2011-148942, Japanese Unexamined Patent Publication No. 2011-168742, and the like.

<Polyolefinic Resin>

Examples of preferred polyolefinic resins used for production of the λ/4 retardation film of the invention include, but should not be limited to, polypropylene and polyethylene resins. Two or more compatible polyolefinic resins may be used in combination. Examples of such resins are disclosed in Japanese Unexamined Patent Publication No. 2007-316603.

In the present invention, cycloolefin resins are preferred among the polyolefinic resins. The cycloolefin resins usable in the invention are polymers having alicyclic structures. Examples of the preferred cycloolefin resins include polymers and copolymers of cyclic olefins. Examples of the cyclic olefin include polycyclic unsaturated hydrocarbons and their derivatives, such as norbornene, dicyclopentadiene, tetracyclododecene, ethyltetracyclododecene, ethylidene tetracyclododecene, and tecracyclo[7.4.0.110,13.02,7]trideca-2,4,6,11-tetraen; monocyclic unsaturated hydrocarbons and their derivatives, such as cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene, cycloheptene, cyclopentadiene, and cyclohexadiene. These cyclic olefins may have polar substituent groups. Examples of the polar groups include hydroxy, carboxy, alkoxyl, epoxy, glycidyl, oxycarbonyl, carbonyl, amino, ester, and carboxylic anhydride. Among them preferred are ester, carboxy, and carboxylic anhydride groups.

The preferred cycloolefinic resins may be addition copolymers with monomers other than the cyclic olefins. Examples of the copolymerizable monomers include ethylene; α-olefins, such as propylene, 1-butene, and 1-pentene; and dienes, such as 1,4-hexadiene, 4-methyl-1,4-hexadiene, 5-methyl-1,4-hexadiene, and 1,7-octadiene.

Cyclic olefin can be prepared by addition polymerization or metathesis ring-opening polymerization. The polymerization is usually carried out in the presence of a catalyst.

An example catalyst for addition polymerization is a polymerization catalyst composed of a vanadium compound and an organic aluminum compound.

Examples of a catalyst for metathesis ring-opening polymerization include polymerization catalysts composed of halides of metals, such as ruthenium, rhodium, palladium, osmium, iridium, and platinum, reducing agents, and nitrates or acetylacetone compounds; and polymerization catalysts composed of acetylacetone compounds or halides of metals, such as titanium, vanadium, zirconium, tungsten, and molybdenum, and organic aluminum compounds.

The polymerization may be carried out at any temperature and pressure, usually at a temperature in a range of −50° C. to 100° C. and a pressure in a range of 0 N/cm$^2$ to 490 N/cm$^2$.

The cycloolefin resin is preferably prepared by polymerization or copolymerization of a cyclic olefin, and then by hydrogenation reaction to convert unsaturated bonds in the molecules into saturation bonds. The hydrogenation reaction is carried out with bubbling hydrogen in the presence of a known hydrogenation catalyst.

Examples of the hydrogenation catalyst include homogeneous catalysts composed of combinations of transition metal compounds and alkyl metal compounds, such as cobalt acetate and triethylaluminum, nickel acetylacetonate and triisobutylaluminum, titanocene dichloride and n-butyllithium, zirconocene dichloride and sec-butyllithium, and tetrabutoxytitanate and dimethyl magnesium; heterogeneous metal catalysts, such as nickel, palladium, and platinum; and heterogeneous solid catalysts composed of metals-on-carriers, such as nickel on silica, nickel on diatom earth, nickel on alumina, palladium oncarbon, palladium on silica, palladium on diatome earth, and palladium alumina.

Other examples of the cycloolefin resins include the following norbornene resins. The norbornene resins should preferably have repeating units of norbornene scheltons. Examples of such resins include, but should not be limited to, those described in Japanese Unexamined Patent Publication No. Shou62-252406, Japanese Unexamined Patent Publication No. Shou62-252407, Japanese Unexamined Patent Publication No. H2-133413, Japanese Unexamined Patent Publication No. Shou63-145324, Japanese Unexamined Patent Publication No. Shou63-264626, Japanese Unexamined Patent Publication No. H1-240517, Japanese Examined Patent Publication No. Shou57-8815, Japanese Unexamined Patent Publication No. H5-2108, Japanese Unexamined Patent Publication No. H5-39403, Japanese Unexamined Patent Publication No. H5-43663, Japanese Unexamined Patent Publication No. H5-43834, Japanese Unexamined Patent Publication No. H5-70655, Japanese Unexamined Patent Publication No. H5-279554, Japanese Unexamined Patent Publication No. H6-206985, Japanese Unexamined Patent Publication No. H7-62028, Japanese Unexamined Patent Publication No. H8-176411, Japanese Unexamined Patent Publication No. H9-241484, Japanese Unexamined Patent Publication No. 2001-277430, Japanese Unexamined Patent Publication No. 2003-139950, Japanese Unexamined Patent Publication No. 2003-14901, Japanese Unexamined Patent Publication No. 2003-161832, Japanese Unexamined Patent Publication No. 2003-195268, Japanese Unexamined Patent Publication No. 2003-211588, Japanese Unexamined Patent Publication No. 2003-211589, Japanese Unexamined Patent Publication No. 2003-268187, Japanese Unexamined Patent Publication No. 2004-133209, Japanese Unexamined Patent Publication No. 2004-309979, Japanese Unexamined Patent Publication No. 2005-121813, Japanese Unexamined Patent Publication No. 2005-164632, Japanese Unexamined Patent Publication No. 2006-72309, Japanese Unexamined Patent Publication No. 2006-178191, Japanese Unexamined Patent Publication No. 2006-215333, Japanese Unexamined Patent Publication No. 2006-268065, Japanese Unexamined Patent Publication No. 2006-299199 and the like. These resins may be used alone or in combination. Preferred examples include Zeonex® and Zeonor® available from Zeon Corporation, Arton® available from JSR Corporation, and Apel® (APL8008T, APL6509T, APL6013T, APL5014DP, and APL6015T) available from Mitsui Chemical Inc.

The cycloolefin resin may have any molecular weight depending on the intended use, and usually has a polyisoprene- or polystyrene-equivalent weight average molecular weight in a range of 5000 to 500000, preferably 8000 to 200000, more preferably 10000 to 100000 to achieve excellent balance between the mechanical strength and processability of the compact. The weight average molecular weight is measured by gel permeation chromatography using a cyclohexane solution (or a toluene solution if the polymer resin is not dissolved in cyclohexane).

(Additive for λ/4 Film)

A λ/4 retardation film of the invention may contain a plasticizer (additive) to enhance the fluidity or flexibility of the composition. Examples of a plasticizer applicable to the invention include phthalate ester plasticizers, fatty acid ester plasticizers, trimellitate ester plasticizers, phosphate ester plasticizers, polyester plasticizers, sugar ester plasticizers, epoxy plasticizers, and polyhydric alcohol ester plasticizers. These plasticizers are used alone or in combination depending on the intended use, and thus have a variety of uses.

The invention may use any additive, preferably an aromatic terminal ester compound or a compound containing a triazine ring. The aromatic terminated ester compound may be oligoester or polyester and has a molecular weight in a range of 100 to 10000, preferably 350 to 3000, an acid value of 1.5 mg KOH/g or less, preferably 0.5 mg KOH/g or less, and a hydroxyl group value of 25 mg KOH/g or less, preferably 15 mg KOH/g or less.

In the present invention, 0.5 to 30 parts by mass, preferably 2.0 to 15 parts by mass of an aromatic compound containing at least three aromatic rings is preferably added to 100 parts by mass of λ/4 retardation film.

In the present invention, a preferred polyhydric alcohol ester is composed of a monocarboxylic acid ester and an aliphatic polyhydric alcohol having two or more hydroxyl groups, and contains an aromatic ring or cycloalkyl ring in a molecule.

Polyhydric alcohol applicable to the present invention is represented by Formula (a).

$R_1-(OH)_n$  Formula (a)

where $R_1$ is an organic group having a valence of n (n is a positive integer of two or more), and OH is an alcoholic or phenolic hydroxyl group.

Examples of preferred polyhydric alcohols include the following compounds:

Adonitol, arabitol, ethylene glycol, diethylene glycol, triethylene glycol, tetraethylene glycol, 1,2-propanediol, 1,3-propanediol, dipropylene glycol, tripropylene glycol, 1,2-butanediol, 1,3-butanediol, 1,4-butanediol, dibutylene glycol, 1,2,4-butanetriol, 1,5-pentanediol, 1,6-hexanediol, hexanetriol, galactitol, mannitol, 3-methylpentane-1,3,5-triol, pinacol, sorbitol, trimethylolpropane, trimethylolethane, and xylitol.

Among them, preferred are triethylene glycol, tetraethylene glycol, dipropylene glycol, tripropylene glycol, sorbitol, trimethylolpropane, and xylitol.

Any monocarbolic acid can be used for production of polyhydric alcohol esters. Examples of such an acid include known aliphatic monocarboxylic acid, alicyclic monocarboxylic acid, and aromatic monocarboxylic acid.

The λ/4 retardation film of the present invention preferably contains an alicyclic or aromatic monocarboxylic acid to have high moisture transmission and retention. Examples of preferred monocarboxylic acids in the invention include, but should not be limited to, the following materials.

Preferred examples of the aliphatic monocarboxylic acid include straight-chain or branched-chain fatty acids with a carbon number in a range of 1 to 32. Its carbon number is more preferably in a range of 1 to 20, most preferably 1 to 10. Acetic acid is preferred to increase compatibility with the cellulose acylate. Alternatively, a mixture of acetic acid and any other monocarboxylic acid is preferred.

Examples of preferred aliphatic montocarbocylic acid include saturated fatty acids, such as acetic acid, propionic acide, butyric acid, valeric acid, caproic acid, enanthic acid, caprylic acid, pelargonic acid, capric acid, 2-ethylhexanecarboxylic acid, undecylic acid, lauric acid, tridecylic acid, myristic acid, pentadecyl acid, palmitic acid, heptadecylic acid, stearic acid, nonadecanoic acid, arachidic acid, behenic acid, lignoceeric acid, cerotic acid, heptacosanoic acid, montanic acid, melissic acid, and lacceric acid; and unsaturated fatty acids, such as undecylic acid, oleic acid, sorbuc acid, linoleic acid, linolenic acid, and arachidonic acid.

Examples of preferred alicyclic monocarboxylic acid include cyclopentanecarboxylic acid, cyclohexanecarboxylic acid, cyclooctanecarboxylic acid, and their derivatives.

Examples of preferred aromatic monocarboxylic acids include benzoic acid; alkylbenzoic acids such as tolic acid; aromatic monoacboxylic acids having two or more benzene rings, such as biphenylcarboxylic acid, naphthalene carboxylic acid, and tetralincarboxylic acid, and their derivatives. Benzoic acid is particularly preferred.

The polhydric alcohol ester may have any molecular weight, and has a molecular weight of preferably 300 to 1500, more preferably 350 to 750.

The polyhydric alcohol ester preferably has a higher molecular weight to reduce volatilization, whereas it preferably has a lower molecular weight to maintain moisture permeability and compatibility with the cellulose acylate.

The polyhydric alcohol ester may contain one or more carboxylic acids. The OH groups in the polyhydric alcohol may be esterified completely or partially.

In the present invention, a compound containing a triazine ring preferably has a discoidal shape for the $\lambda/4$ retardation film to exhibit high retardation and to reduce the moisture content. The molecular weight of such a compound is preferably in a range of 300 to 2,000. In the invention, such a discoidal compound has a boiling point of 260° C. or more. The boiling point can be measured with a commercially available device (e.g., TG/DTA100 available from Seiko Instruments Inc.).

The $\lambda/4$ retardation film of the invention or a protective film described later preferably contains an ultraviolet absorber. Examples of the ultraviolet absorber include benzotriazoles, 2-hydroxybenzophenones, and phenyl salicylate esters. Specific examples include triazoles, such as 2-(5-methyl-2-hydroxyphenyl)benzotriazole, 2-[2-hydroxy-3,5-bis($\alpha,\alpha$-dimethylbenzyl)phenyl]-2H-benzotriazole, and 2-(3,5-di-t-butyl-2-hydroxyphenyl)benzotriazole; and benzophenones, such as 2-hydroxy-4-methoxybenzophenone, 2-hydroxy-4-octoxybenzophenone, 2,2'-dihydroxy-4-methoxybenzophenone.

An ultra violet absorber having a molecular weight of 400 or more barely volatilizes at high temperatures and barely evaporates during high-temperature processes, effectively providing desired weatherability at a small amount.

Examples of the uv absorber having a molecular weight of 400 or more include benzotriazoles, such as 2-[2-hydroxy-3,5-bis($\alpha,\alpha$-dimethylbenzyl)phenyl]-2-benzotriazole and 2,2-methylenebis[4-(1,1,3,3-tetrabutyl)-6-(2H-benzotriazole-2-yl)phenol]; hindered amines, such as bis(2,2,6,6-tetramethyl-4-piperydyl)cebacate and bis(1,2,26,6-pentamethyl-4-piperydyl) cebacate; and hybrids having structures of hindered phenols and hindered amines in their molecules, such as bis(1,2,2,6,6-pentamethyl-4-piperydyl) 2-(3,5-di-t-butyl-4-hydroxybenzyl)-2-n-butylmalonate, and 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine. These compounds may be used alone or in combination. Among them, particularly preferred are 2-[2-hydroxy-3,5-bis($\alpha,\alpha$-dimethylbenzyl)phenyl]-2-benzotriazole and 2,2-methylenebis[4-(1,1,3,3-tetrabutyl)-6-(2H-benzotriazole-2-yl)phenol].

These compounds are commercially available under the trade name Tinuvin series (Tinuvin 109, Tinuvin 171, Tinuvin 234, Tinuvin 326, Tinuvin 327, Tinuvin 328, and Tinuvin 928 from BASF Japan.

The $\lambda/4$ retardation film may contain any antioxidant to prevent thermal decomposition and thermal coloration during the film-forming process. The $\lambda/4$ retardation film may contain an antistatic agent to prevent its electrostatic charge.

The $\lambda/4$ retardation film of the invention may be composed of a flame retardant acrylic resin composition containing a phosphorous flame retardant. Examples of the phosphorous flame retardant in the invention include red phosphorous, triaryl phosphate esters, diaryl phosphate esters, monoaryl phosphate esters, aryl phosphonate compounds, aryl phosphine oxide compounds, condensed aryl phosphate esters, halogenated alkyl phosphate esters, halogenated condensed phosphate esters, halogenated condensed phosphate esters, and halogenated phosphite esters. These phosphorous flame retardants may be used alone or in combination.

Examples of the phosphorous flame retardant include triphenyl phosphate, 9,10-dihydro-9-oxa-10-phosphaphenanthrene-10-oxide, phenyl phosphonate, tris($\beta$-chloroethyl)phosphate, tris(dichloro-propyl)phosphate, and tris(tribromoneopentyl)phosphate.

The $\lambda/4$ retardation film of the invention preferably contains a matting agent of a cross-linked polymer or a particulate inorganic compound, such as silicon dioxide, titanium dioxide, aluminum oxide, zirconium oxide, calcium carbonate, kaolin, talc, calcined calcium silicate, hydrated calcium silicate, aluminum silicate, magnesium silicate, or calcium phosphate, in order to improve the handling of the film. Among them, silicon dioxide is preferred for the film to have low haze.

The average size of the primary particles is preferably 20 nm or less, more preferably in a range of 5 to 16 nm, most preferably 5 to 12 nm.

The $\lambda/4$ retardation film according to the invention should be resistant for use in a high-temperature environment. The $\lambda/4$ retardation film having sufficient thermal resistance shows tension softening at a temperature of preferably 105° C. to 145° C., and more preferably 110° C. to 130° C.

To acquire the temperature of the tension softening point, for example, a piece of 120 mm (length) by 10 mm (width) is cut out from a sample film, and is stretched at a tension of 10 N while being heated at a rate of 30° C./min, and the temperature when the tension softening point becomes 9N is measured three times and averaged, with a tensile tester (Tensilon RTC-1225A made by ORIENTEC Co., Ltd.).

The glass transition temperature is a mid-point glass transition temperature (Tmg) measured at a heating rate of 20° C./min with a differential scanning calorimeter (DSC-7 made by PerkinElmer) in accordance with JIS K 7121-1987.

The $\lambda/4$ retardation film in the organic EL display device according to the invention has a size variation rate (%) of preferably lower than 0.5%, and more preferably lower than 0.3%, to prevent a size variation due to the moisture absorption, thereby preventing unevenness, a variation in retardation, a decrease in contrast, and uneven color.

It is preferred that the $\lambda/4$ retardation film according to the invention have less defects. The defects include bubbles in the film (bubbling defects) due to sudden evaporation of the solvent during a drying process in the solution casting, and contaminants in the film (contamination defects) that are derived from the original solution or introduced during the film formation.

In specific, the density of defects having a diameter of at least 5 μm in the film is preferably one defect for 10 $cm^2$ or lower, more preferably 0.5 defect for 10 $cm^2$ or lower, and even more preferably 0.1 defect for 10 $cm^2$ or lower.

The diameter of a defect refers to the diameter of a circular defect, or the largest dimension (diameter of the circumcircle) of the area of a non-circular defect that is determined in the following process with a microscope.

The area of a bubbling defect or a contamination defect is determined by observation of the shadow of the defect with transmitted light in a differential interference contrast microscope. The area of a defect of the surface profile, such as a scratch or a pattern printed by a scratch on the roller, is determined by observation of the defect with reflected light in the differential interference contrast microscope.

The deposition of aluminum or platinum on the surface of the defect helps clear determination of its area in the observation with reflected light. A high-quality film having a preferred defect density can be effectively fabricated by a high-accuracy filtration of the polymer solution immediately before the casting process, the cleaning around the casting machine, and/or an effective drying process reducing bubbling under stepwise drying conditions after the casting process.

A film having a defect density of higher than one defect for 10 cm$^2$ may be broken around the defect by a tension on the film during a downstream process, thereby decreasing the productivity. A defect having a diameter of 5 μm or larger is visible in the observation of the polarizing plate, and an optical member having such a defect may cause a bright spot.

The λ/4 retardation film according to the invention has an elongation at break of preferably 10% or higher, and more preferably 20% or higher in at least one direction. The elongation at break is measured in accordance with JIS K 7127-1999.

The upper limit of the elongation at break should not be limited, but approximately 250% in practice. The elongation at break is increased by the reduction of the contamination and bubbling defects in the film.

The λ/4 retardation film according to the invention has a total light transmittance of preferably 90% or higher, and more preferably 93% or higher. The practical upper limit of the total light transmittance is approximately 99%. The excellent transparency indicated by the preferred total light transmittance is achieved by no introduction of copolymer components or additives that absorb visible light, and/or the removal of contaminants from the polymer by a high-accuracy filtration to prevent the diffusion and absorption of light inside the film. The excellent transparency is also achieved by the smoothing of the surface of the mechanical units to come into contact with a film during its formation process (e.g., cooling rollers, calender rollers, drums, belts, a coating base for the solution casting, and conveying rollers), which smooths the surface of the film and therefore prevents the diffusion and reflection of light at the film surface.

(Method of Forming λ/4 Retardation Film)

An exemplary method of forming the λ/4 retardation film according to the invention will now be explained. The method should not be limited to the example.

The λ/4 retardation film according to the invention may be formed by, for example, inflation molding, a T-die method, calendering, cutting, casting, an emulsion method, or hot pressing. Any other process also may be applied.

The λ/4 retardation film according to the invention may be formed by solution casting or melt casting.

The solution casting is preferable to prevent tinting, contamination defects, and optical defects, such as die lines, of a film. The melt casting is preferable to eliminate the residue of the solvents dissolving the resin. Examples of the melt casting include extrusion molding, press molding, inflation molding, injection molding, blow molding, and stretch molding. The extrusion molding is most preferable among them to fabricate a film having high mechanical strength and surface smoothness.

<Solution Casting>

The λ/4 retardation film of the invention can be prepared by solution casting. The solution casting includes the steps of dissolving a resin and additives in an organic solvent to prepare a dope, casting the dope on a belt or drum metal support, drying the dope (web), detaching the dope from the metal support, drawing the dope or holding the width of the dope, and further drying the dope, and winding the finished film.

Solution casting for fabricating a λ/4 retardation film of the invention may use any organic solvent that can dissolve all the polycarbonate resin, cellulose acylate, and other additives, to efficiently prepare a dope.

Examples of the organic solvent include chlorinated organic solvent, such as methylene chloride; and nonchlorinated organic solvents, such as methyl acetate, ethyl acetate, amyl acetate, acetone, tetrahydrofran, 1,3-dioxolane, 1,4-dioxane, cyclohexanone, ethyl formate, 2,2,2-trifluoroethanol, 2,2,3,3-hexafluoro-1-propanol, 1,3-difluoro-2-propanol, 1,1,1,3,3,3-hexafluoro-2-methyl-2-propanol, 1,1,1,3,3,3-hexafluoro-2-propanol, 2,2,3,3,3-pentafluoro-1-propanol, and nitroethane. Particularly preferred are methylene chloride, methyl acetate, ethyl acetate, and acetone.

The dope preferably contains 1 to 40 mass % straight-chain or branched-chain aliphatic alcohol with a carbon number of 1 to 4, in addition to the organic solvent described above. A dope with a high alcohol content causes the web to gelate and is readily detachable from the metal support. A dope with a low alcohol content promotes the dissolution of cellulose acylate in a non-chlorinated organic solvent.

An example of the dope is a composition of an acrylic resin, a cellulose ester resin, and acrylic particles dissolved in a solvent containing a methylene chloride and a straight-chain or branched-chain aliphatic alcohol with a carbon number of 1 to 4, in a total amount of 15 to 45 mass %.

Examples of the straight-chain or branched-chain aliphatic alcohol with a carbon number of 1 to 4 include methyl alcohol, ethyl alcohol, n-propyl alcohol, iso-propyl alcohol, n-butyl alcohol, sec-butyl alcohol, tert-butyl alcohol. Among them, ethyl alcohol is preferred, which stabilizes the dope and has a low boiling point and high volatility.

The cellulose acylate content in the dope is preferably high to reduce the drying load of the dope after casting on the metal support. An excessively high content of cellulose acylate, however, leads to high filtration load, inhibiting the filtration operation. Accordingly, the content of cellulose acetate in the dope is preferably in a range of 10 to 35 mass, more preferably 15 to 25 mass %. The metal support for the casting preferably has a mirror-finished surface, specifically a stainless-steel belt or a cast drum having a plating surface.

The casting width may be in a range of 1 to 4 m. The surface temperature of the metal support for the casting is higher than or equal to −50° C. and lower than or equal to a temperature not causing bubbling by boiling of the organic solvent. A higher surface temperature of the metal support is preferred to promote the dryness of the web. An excessively high temperature of the metal support, however, causes bubbling in the web and results in low surface smoothness.

The temperature of the metal support is preferably in a range of 0 to 100° C., more preferably 5 to 30° C. A preferred approach is to cool the metal support to cause the web to gelate and remove the web containing a large amount of residual solvent from the drum. The temperature of the metal support may be controlled by any method, e.g., blowing warm or cold air or bringing the rear surface of the metal support into contact with warm water. Warm water is preferred because it efficiently transmits heat, thus shortening the time until the metal support has a uniform temperature.

The warm air may have a temperature above the boiling point of the organic solvent and above the target temperature to prevent a drop in the temperature of the web due to the evaporative latent heat of the organic solvent and bubbling.

The temperatures of the support and the drying air are preferably regulated during the step from casting to removal for efficient drying.

For the λ/4 retardation film to have high surface smoothness, the amount of the residual solvent for the removal of the web from the metal support is preferably in a range of 10 to 150 mass %, more preferably 20 to 40 mass % or 60 to 130 mass %, most preferably 20 to 30 mass % or 70 to 120 mass %.

In the present invention, the amount of residual solvent is determined by the following expression:

Amount of residual solvent(mass %)={(M−N)/N}×100 where M is the mass of the sample during or after the fabrication of the web or film and N is the mass of the sample after heating at 115° C. for one hour.

The drying of the λ/4 retardation film includes detaching the web from the metal support and drying the web until the amount of the residual solvent becomes 1 mass % or less, more preferably 0.1 mass % or less, most preferably in a range of 0 to 0.01 mass %.

The web is dried during transportation by, for example, a roller drying process (in which both surfaces of the web are alternately dried on multiple staggered rollers) or a tentering process.

<Stretching Process>

It is preferred that the λ/4 retardation film according to the invention have an in-plane retardation Ro(550) of 100 to 180 nm at a wavelength of 550 nm. The retardation Ro(550) should preferably be achieved by the stretching of the film.

The film may be stretched by any stretching technique. Examples of the technique include the longitudinal stretching of the film between rollers having mutually different circumferential speeds, the longitudinal stretching of the film web with clips or pins holding the side edges of the film web and moving apart from each other in the moving direction, the lateral stretching with clips or pins moving in the lateral direction, and the simultaneous stretching in both the longitudinal and lateral directions. These techniques may be properly combined. That is, the film may be stretched in the lateral direction, the longitudinal direction, or both directions relative to the direction of film formation. The film may be stretched in two directions simultaneously or sequentially. In the method using a tenter, the linear driving of the clips is preferable to smoothly stretch the film and reduce the risk of its breakage.

It is particularly preferred in the invention that the film be stretched in the moving direction by a differential circumferential speed between the film conveying rollers, or stretched in the direction orthogonal to the moving direction (also referred to as "width direction" or "TD direction") with a tenter including clips to hold the side edges of the film web. The preferred tenter can control right and left holders independently from each other to determine the distances between clipped positions of a film web (distances from the film catching positions to the film releasing positions).

It is also preferred that the λ/4 retardation film according to the invention be stretched in the direction of 45° from the moving direction for effective fabrication of the λ/4 retardation film.

As is explained above, it is preferred that the polarizing film having a transmission axis parallel to the longitudinal direction be laminated on the λ/4 retardation film having an alignment angle of substantially 45° in a roll-to-roll manner, such that their longitudinal directions are parallel to each other. This method facilitates fabrication of a long roll of circularly polarizing plate with less loss in cutting of the film.

The specific process of stretching the film in the direction of 45° will now be described.

A diagonally stretching tenter is preferable to provide the original long film with diagonal alignment in the fabrication of the λ/4 retardation film according to the invention. The diagonally stretching tenter can appropriately determine the alignment angle of the film with a widely variable rail patterns, provide an accurate and even alignment axis to the film across the width direction, and accurately control the thickness and retardation of the film.

Figure 3A:
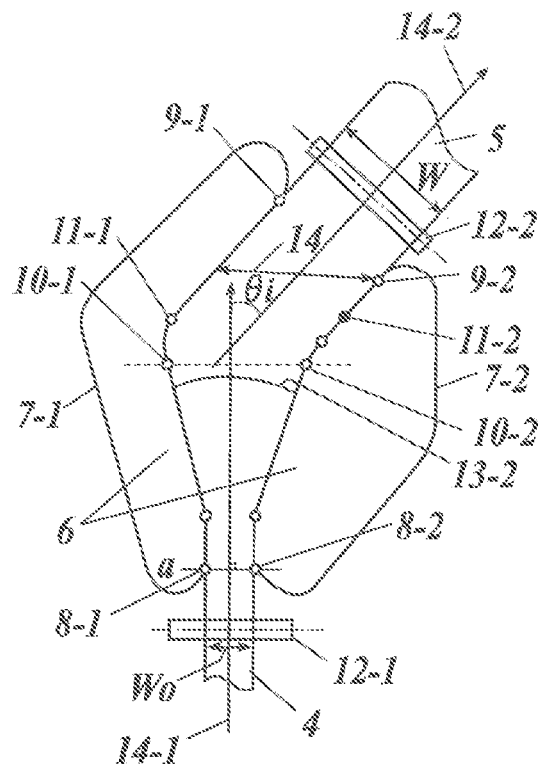
FIG. 3A is a schematic diagram illustrating an example diagonally stretching tenter used for fabrication of a λ/4 retardation film according to the invention.
Figure 3B:
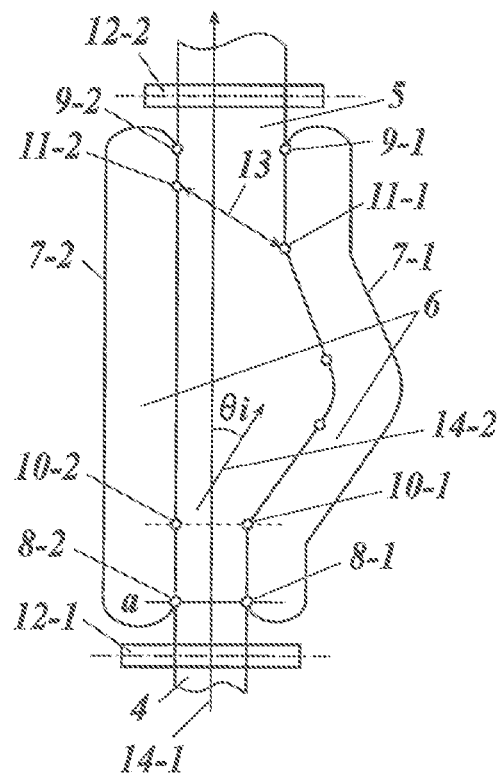
FIG. 3B is a schematic diagram illustrating another example diagonally stretching tenter used for fabrication of a λ/4 retardation film according to the invention.

FIGS. 3A and 3B are each a schematic diagram illustrating an example diagonally stretching tenter to fabricate the λ/4 retardation film according to the invention. The example is for illustrative purpose not for limitation.

In the tenter configuration 1 of the diagonally stretching tenter illustrated in FIG. 3A, the original long film 4 is directed toward a certain direction by an entrance guide roller 12-1, is caught with holders (clips) at an outer film catching position 8-1 and an inner film catching position 8-2, is conveyed and stretched by the diagonally stretching tenter 6 in diagonal directions illustrated as a path 7-1 of the outer film holder and a path 7-2 of the inner film holder, is released at an outer film releasing position 9-1 and an inner film releasing position 9-2, and is conveyed under the control of an exit guide roller 12-2. This process yields a diagonally stretched film 5. In FIG. 3A, the original long film is diagonally stretched in a stretching direction 14-2 tilted by a conveying angle θi from an initial moving direction 14-1.

FIG. 3B illustrates another configuration 2 of the diagonally stretching tenter, which can stretch the film as in the configuration 1 illustrated in FIG. 3A.

The process of fabricating the λ/4 retardation film according to the invention involves a stretching process with the diagonally stretching tenter. The tenter increases the width of the original long film in a direction diagonal to the moving direction (traveling direction of the widthwise center of the film) while heating the film with an oven. The tenter includes the oven, a pair of right and left rails each defining the traveling path of holders to convey the film, and a large number of holders traveling along the rails. The film unrolled from a roll and sequentially fed to the entrance of the tenter, is held with the holders at the side edges of the film, is conveyed through the oven, and is released from the holders at the exit of the tenter. The film released from the holders is wound around a core. The endless continuous rails each allow holders that released the film at the exit of the tenter to sequentially travel along the outer part of the rail and return to the entrance.

The right and left rails of the tenter have mutually different shapes that can be manually or automatically fine-adjusted depending on the desired alignment angle θ and stretching ratio of the long stretched film, as illustrated in FIGS. 3A and 3B. In the invention, the long λ/4 retardation film may have any alignment angle θ preferably between 10° to 80° from the winding direction of the stretched film.

The holders may travel at any speed, and typically at a speed between 1 to 100 m/min. The percentage of the difference in traveling speed between the right and left holders to the traveling speed is typically 1% or lower, preferably 0.5% or lower, and more preferably 0.1% or lower. The difference in moving speed between the right and left edges of the film would cause creases and puckering of the film at the end of the stretching process; hence, the difference in traveling speed between the right and left holders should be substantially zero. The speed difference does not refer to irregularities in speed of less than one second (which often corresponds to several percent) caused by the teeth intervals of a sprocket driving a chain and the frequency of the drive motor in a general tenter.

It is preferred in the diagonally stretching tenter according to the invention that the rail components and the joints therefor be disposed at any position. The diagonally stretching tenter having a predetermined entrance width and exit width can achieve a stretching ratio corresponding to the widths (the symbols "o" in the figures represent the joints).

In the diagonally stretching tenter according to the invention, the rails defining the paths of holders should often be greatly bent. It is desirable that a bend in the paths of the holders form an arc, to avoid interference between the holders or local concentration of stress due to a steep bend.

In the diagonally stretching tenter illustrated in FIG. 3A, the initial moving direction 14-1 of the original long film at the entrance differs from the eventual moving direction 14-2 of the stretched film at the exit. The conveying angle θi is defined by the eventual moving direction 14-2 at the exit from the initial moving direction 14-1 at the entrance.

In the diagonally stretching tenter illustrated in FIG. 33, the original long film conveyed in the initial moving direction 14-1 at the entrance is turned by the conveying angle θi to another direction during the conveyance. The film is further turned to the eventual moving direction of the stretched film at the exit.

In the invention, the conveying angle θi is within 10<θi<60°, and preferably 15°<θi<50°, to fabricate the above-described preferable film having an alignment angle θ between 10° to 80°. The conveying angle Gi within the preferable range can achieve a desired small variation in the optical characteristics of the resulting film in the width direction.

In the invention, each holder pair of the tenter travels at a constant speed while maintaining constant intervals from the adjacent holder pairs.

Figure 4A:
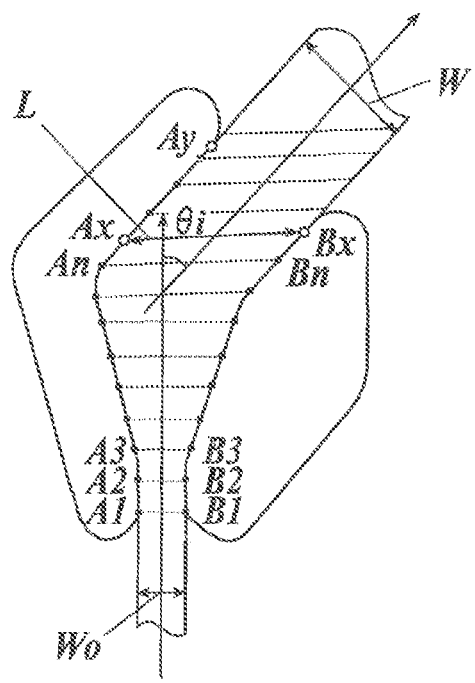
FIG. 4A is a schematic diagram illustrating an example stretching direction in the diagonally stretching tenter in FIG. 3A.
Figure 4B:
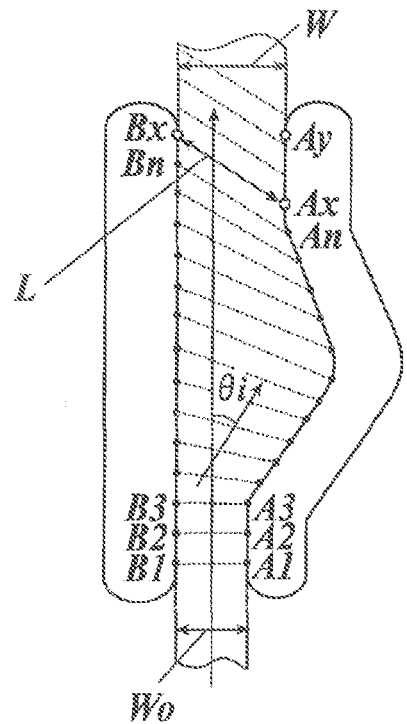
FIG. 4B is a schematic diagram illustrating an example stretching direction in the diagonally stretching tenter in FIG. 3B.

FIGS. 4A and 4B are schematic diagrams illustrating the stretching directions in the diagonally stretching tenters illustrated in FIGS. 3A and 3B, respectively.

In the invention, right and left holders respectively travel at a substantially constant speed from the right and left positions for catching the side edges of the conveyed film, i.e., the film catching position A1 and the intersection B1 of the path of the right holder and the straight line extending from the position A1 substantially perpendicularly to the center line of the introduced film (the opposed film catching position B1), as illustrated in FIGS. 4A and 4B. The left holder travels to A1, A2, and A3 every unit time and reaches a final stretching position An, while the right holder travels to B1, B2, and B3 and reaches a final stretching position Bn. In this stretching process, the position An is gradually delayed from the position Bn, so that the stretching direction is gradually tilted from the width direction, as illustrated in FIGS. 4A and 4B. The substantial releasing positions (at which the conveyed film is released from the holders) are defined as the releasing position Bx (at which both or either one of the side edges of the conveyed film is released from the holders) and the intersection Ay of the path of the left holder and the straight line extending from the position Bx substantially perpendicularly to the center line of the exiting film. The phrase "substantially perpendicularly" refers to the range of 90±1°.

The angle of the eventual stretching direction of the film is determined based on the ratio of the distance W between the releasing positions (between the positions Bx and Ay) to the distance between the positions Ax and Ay.

The angle θf of the stretching direction from the eventual moving direction satisfies the following expression:

$$\tan\theta f = W/(Ay-Ax)$$

that is, $$\tan\theta f = W/|LA-LB|.$$

where LA indicates a traveling distance of a holder from the film catching position to the film releasing position along the longer rail; LB indicates that along the shorter rail; |LA−LB| indicates a difference in traveling distance between the right and left holders along the respective rails to the film releasing positions.

The definition of the stretching ratio in the invention will now be described with reference to FIGS. 4A and 4B.

The stretching ratio R in the diagonally stretching tenter is defined by the following expression:

$$R = L/Wo$$

where Wo is a linear distance between the film catching positions A1 and B1 of the holders upon catching the conveyed film in the diagonally stretching tenter, and L is a linear distance between the final stretching positions Ax and Bx of the holders upon completely passing through all the stretching zones in the diagonally stretching tenter, as illustrated in FIGS. 4A and 4B.

The stretching ratio R is preferably 1.3 to 3.0, and more preferably 1.5 to 2.5. A stretching ratio within the preferable range can reduce the unevenness of the thickness across the width direction. A variation in temperature across the width direction in the stretching zones of the diagonally stretching tenter can further reduce the unevenness of the thickness across the width direction to a more preferred level.

In the diagonally stretching tenter, the original long film is held at the side edges sequentially with right and left holders at the entrance (illustrated with reference numeral a), and is conveyed in accordance with the movement of the holders, as illustrated in FIGS. 3A and 3B. The right and left holders, which are opposed to each other in a direction substantially perpendicular to the initial moving direction 14-1 at the entrance (illustrated with reference sign a), travel along the rails having different shapes through the oven having a preheating zone, a laterally stretching zone, a diagonally stretching zone, a holding zone, and a cooling zone.

The film is not necessarily required to pass through all the zones in the order mentioned. The zone configuration may consist of only some of the zones, or include any duplicate zone, as in the following example configuration.

1) preheating zone/diagonally stretching zone/holding zone/cooling zone 2) preheating zone/laterally stretching zone/diagonally stretching zone/holding zone/cooling zone 3) preheating zone/diagonally stretching zone/laterally stretching zone/holding zone/cooling zone 4) preheating zone/laterally stretching zone 1/diagonally stretching zone/laterally stretching zone 2/holding zone/cooling zone 5) preheating zone/laterally stretching zone 1/diagonally stretching zone 1/laterally stretching zone 2/diagonally stretching zone 2/holding zone/cooling zone Through the preheating zone near the entrance of the oven, the holders holding the edges of the film travel while maintaining an interval between the holders.

Through the laterally stretching zone, the holders holding the edges of the film separate from each other before achieving a predetermined interval between the holders. The rails for the right and left holders may be tilted outward by the identical angle, or may be tilted outward by mutually different angles.

Through the diagonally stretching zone, the holders holding the edges of the film travel along the bent rails while maintaining or increasing the interval between the holders, before reaching the straight rails.

Through the holding zone downstream of the laterally stretching zone or diagonally stretching zone, the right and left holders travel in parallel to each other with a constant interval therebetween.

The temperature in the cooling zone downstream of the holding zone is not higher than the glass transition temperature Tg (° C.) of the thermoplastic resin in the film.

The rails may be shaped to decrease the interval between the opposed holders in accordance with the shrinkage of the cooled film.

The preferable temperature is Tg to Tg+30° C. in the pre-heating zone, Tg to Tg+30° C. in the stretching zones, and Tg−30° C. to Tg in the cooling zone (Tg indicates the glass transition temperature of the thermoplastic resin).

The temperature in the stretching zones may vary in the width direction to reduce the unevenness of the thickness across the width direction. The temperature in the width direction may be varied by any known technique, such as a variable opening of a nozzle for supplying a warm air stream into a thermostatic chamber across the width direction, and the heating with heaters arranged in the width direction.

The creases and puckering of the long stretched film can be prevented by, for example, stretching the film while steadily supporting the film and maintaining its volatile component to at least 5% by volume, and then reducing the volatile component during the shrinkage of the film. The steady support of the film in the invention refers to the holding of the side edges of the film while maintaining its characteristics. The volatile component may be maintained to be at least 5% by volume during the entire stretching process or during only a part of the stretching process. In the latter case, it is preferred that the volatile component be at least 12% by volume in at least 50% of the entire zones starting from the entrance. In both cases, the volatile component before the stretching process should preferably be at least 12% by volume. The volatile component (unit: % by volume) refers to the volume of the volatile constituents of the film for unit volume, and is determined by dividing the volume of the volatile constituents by that of the film.

The guide roller closest to the entrance of the tenter is a driven roller to guide the traveling of the film, and is rotatably supported by a shaft via bearings. The rollers may be composed of any known material. Lightweight rollers are preferably prepared by, for example, application of ceramic coating to prevent scratches on the film, and chromium plating on a light metal such as aluminum. The rollers can stabilize the traveling path of the film.

It is preferred that one of the upstream rollers be put into contact with a rubber roller to nip the conveyed film. Such a nip roller can reduce a fluctuation in the tension on the fed film in its moving direction.

The right and left bearings on both sides of the guide roller closest to the entrance of the tenter are provided with a first film tension detector and a second film tension detector, respectively, to detect the tension applied on the film by the roller. A typical film tension detector is a known load cell of a pulling type or compression type. The load cell detects a load on the load center on the basis of electric signals converted from the load with a strain gauge attached to an object causing strain.

The load cells are disposed to the bearings on right and left sides, respectively, of the guide roller closest to the entrance of the diagonally stretching tenter, and independently detect the force exerted onto the roller by the moving film, i.e., tensions near the side edges of the film in the moving direction. The load cells may detect loads (i.e., tensions on the film) on the basis of the strain in supports of the bearings for the roller, which is detected with strain gauges directly attached to the supports. The relationship between a tension on the film and the resulting strain is determined in advance.

The film tension detectors detect tensions near the side edges of the film at the guide roller closest to the entrance of the diagonally stretching tenter. If the position and orientation of the film deviate from those of the entrance of the film stretcher, the film tension detectors determine a difference in tension of the film between the right and left edges at the guide roller closest to the entrance of the diagonally stretching tenter, to determine the degree of deviation that causes the difference in tension. If the position and orientation of the film coincide with those of the entrance of the film stretcher, the right and left sections of the roller receive substantially equal loads; otherwise the right and left edges of the film have different tensions.

That is, the position and orientation of the film should be properly adjusted to equalize the tensions on the right and left edges of the film at the guide roller closest to the entrance of the diagonally stretching tenter. This configuration can ensure the holders to catch the film at the entrance of the film stretcher, and prevent the holders from unintentionally separating from the film. This configuration can also stabilize physical properties in the width direction of the film diagonally stretched by the film stretcher.

The angle of the initial moving direction of the film at the entrance of the diagonally stretching tenter from the eventual moving direction of the film at the exit of the diagonally stretching tenter should be adjusted for refinement of the alignment angle and fabrication of a wide variety of films. It is preferred that the film be formed and diagonally stretched in succession to increase the productivity and yield. For the successive processes of formation, diagonal stretching, and winding of the film, it is preferred that the film be conveyed in a constant direction during the formation and winding processes to narrow the width of the processing route. This configuration requires the turn of the formed film toward the entrance of the diagonally stretching tenter, and/or the turn of the film discharged from the exit of the diagonally stretching tenter toward the winder. The film may be turned by any known device such as a conveying roller with an airflow. The devices (e.g., a winder, accumulator, and driver) downstream of the diagonally stretching tenter are preferably slidable in the lateral direction.

Another exemplary method of forming the λ/4 retardation film according to the invention will now be explained with reference to the figures.

Figure 5A:
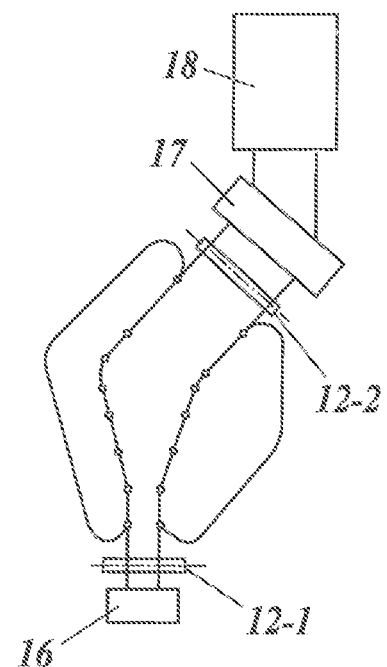
FIG. 5A is a schematic diagram illustrating an example process (for unrolling an original long film from a roll and diagonally stretching the film) according to an embodiment of the invention.
Figure 5B:
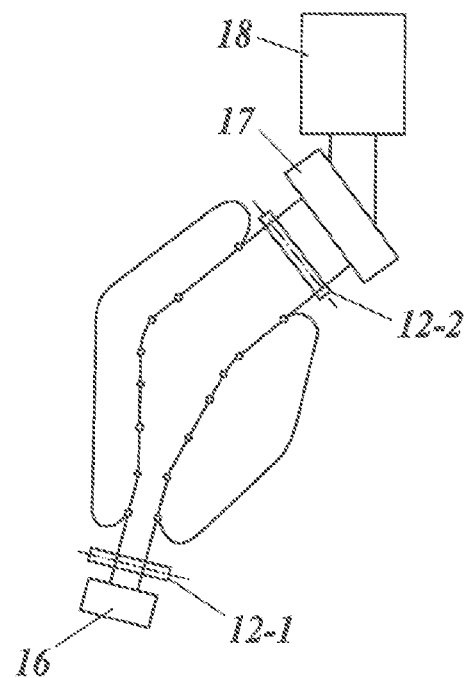
FIG. 5B is a schematic diagram illustrating another example process (for unrolling an original long film from a roll and diagonally stretching the film) according to the embodiment of the invention.

FIGS. 5A to 5C are each a schematic diagram illustrating an example fabrication process of unrolling the original long film from a roll and diagonally stretching the film, according to an embodiment of the invention.

Figure 6A:
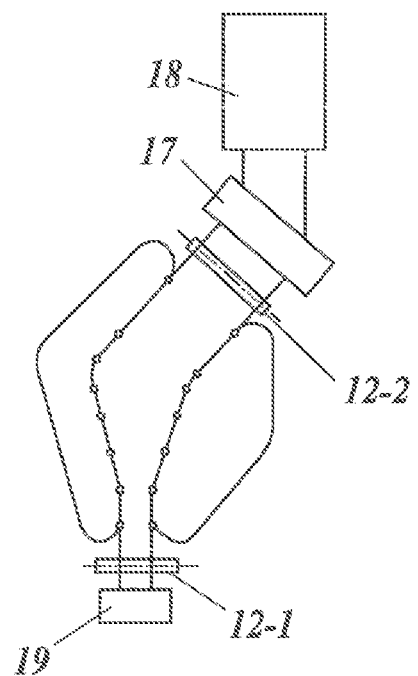
FIG. 6A is a schematic diagram illustrating another example process (for advancing an original long film directly to the diagonal stretching without rolling) according to the embodiment of the invention.
Figure 6B:
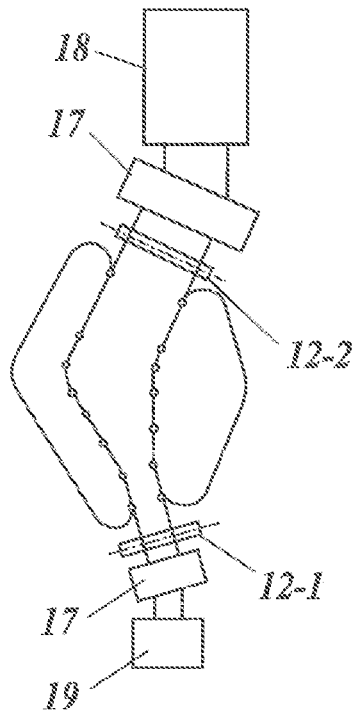
FIG. 6B is a schematic diagram illustrating another example process (for advancing an original long film directly to the diagonal stretching without rolling) according to the embodiment of the invention.

FIGS. 6A and 6B are each a schematic diagram illustrating another example fabrication process of advancing the original long film directly to the diagonal stretching without rolling, according to the embodiment of the invention.

FIGS. 5A to 5C each illustrate an example fabrication process of unrolling the rolled original long film and diagonally stretching the film, while FIGS. 6A and 6B each illustrate another example fabrication process of advancing the original long film directly to the diagonal stretching without rolling.

FIGS. 5A to 5C each illustrate a film feeder 16, a moving direction changer 17, a winder 18, a film former 19, the entrance guide roller 12-1, and the exit guide roller 12-2.

It is preferred that the film feeder 16 be slidable and rotatable to feed the film at a predetermined angle from the entrance of the diagonally stretching tenter. Alternatively, the film feeder 16 should preferably be slidable and the moving direction changer 17 turn the fed film toward the entrance of the diagonally stretching tenter. The film feeder 16 and the moving direction changer 17 having such configurations can further narrow the width of the entire fabrication machine and finely control the position and angle of the film feeding, thereby yielding a stretched film having a small variation in the thickness and optical characteristics. The movable film feeder 16 and moving direction changer 17 can facilitate the right and left clips to successfully catch the film.

The winder 18, which winds the film at a predetermined angle from the exit of the diagonally stretching tenter, can finely control the position and angle of the film winding, thereby yielding a stretched film having a small variation in the thickness and optical characteristics. This configuration can effectively reduce creases in the film and facilitate the winding of the film and thus the winding of a long film. In the invention, the tension T (N/m) to wind the stretched film is within 100 N/m<T<300 N/m, preferably 150 N/m<T<250 N/m.

A tension T to wind the stretched film of higher than 100 N/m can reduce creases and puckering of the film, and appropriately control the retardation and the profile of the alignment axis in the width direction. A tension T to wind the stretched film of lower than 300 N/m can reduce the variation in the alignment angle across the width direction, thereby increasing the width yield (production efficiency in the width direction).

In the invention, a fluctuation in the winding tension. T is preferably lower than ±5%, and more preferably lower than ±3%. A fluctuation in the winding tension T of lower than ±5% can reduce the variation in the optical characteristics in the width and moving directions of the film. It is preferred that the fluctuation in the winding tension T be controlled within the preferable range by, for example, measuring a load on the roller closest to the exit of the tenter (i.e., a tension on the film), and then controlling the rotational speed of a winding roller to keep the tension constant under a typical proportional-integral-derivative control (PID control). The load on the roller (i.e., the tension on the film) is measured with, for example, the load cells provided to the bearings for the roller. The load cell is of any known load type, for example, a pulling type or a compression type.

The stretched film is released from the holders and discharged from the exit of the tenter. After trimming of the side portions of the film that were held by the holders, the film is sequentially wound around a winding roller. This process yields rolled layers of the stretched film.

If necessary, the stretched film may be wound together with a masking film overlaid thereon, or a tape bonded to at least one and preferably both edges of the stretched film, to prevent the adjacent layers of the stretched film from blocking each other. The masking film may be composed of any material, polyethylene terephthalate, polyethylene, and polypropylene, which can protect the stretched film.

It is preferred that the alignment angle θ of the stretched film resulting from the above-explained fabrication process be tilted by any angle between 10° and 80° from the winding direction. It is also preferred that the variation in the in-plane retardation Ro be 4 nm or smaller and the variation in the alignment angle θ be 1.0° or smaller across the direction of the width of at least 1300 mm.

In the invention, the variation in the in-plane retardation Ro of the stretched film is 4 nm or smaller, and preferably 3 nm or smaller, within at least 1300 mm in the width direction. An organic electroluminescent display device, which includes a retardation film having a preferable variation in the in-plane retardation Ro, has improved display quality.

In the invention, the variation in the alignment angle θ of the stretched film is 1.0° or smaller, and preferably 0.80° or smaller, within at least 1300 mm in the width direction. The organic electroluminescent display device, which includes a circularly polarizing plate including a polarizer and a stretched film having a variation in the alignment angle θ of 1.0° or smaller, has improved resistance to light leakage and improved contrast.

In the invention, the in-plane retardation Ro of the stretched film is appropriately determined depending on the design of a display device including the film. The in-plane retardation Ro is determined by multiplying the difference between the refractive index $n_x$ in the slow-axis direction in the film and the refractive index $n_y$ in the direction perpendicular to the slow-axis direction in the film, by the average thickness d of the film (i.e., Ro=$(n_x-n_y)\times d$), as described above.

In the invention, the average thickness of the stretched film is preferably 20 to 80 μm, more preferably 30 to 60 μm, and even more preferably 30 to 40 μm, to fabricate a film having high mechanical strength.

The unevenness of the thickness in the width direction (the difference between the maximum thickness and the minimum thickness) is preferably 3 μm or smaller, and more preferably 2 μm or smaller, to maintain the stable winding of the film.

<Melt Film Formation>

The λ/4 retardation film according to the invention may be fabricated by the melt film formation. The melt film formation is a process of heating a composition containing resin and additives such as plasticizer to the flow temperature of the resin and then casting the fluid composition containing cellulose acetate.

The film formation by heating and melting is further classified into, for example, extrusion molding, press molding, inflation molding, injection molding, blow molding, and stretch molding. The extrusion molding is most preferable among them to fabricate a film having high mechanical strength and surface smoothness. It is preferred that raw materials for extrusion molding be kneaded and pelletized in advance.

The materials may be pelletized by any known technique, for example, by feeding a dried cellulose resin, a plasticizer, and other additives to a uniaxial or biaxial extruder from a feeder; kneading the composition with the extruder; extruding the mixture from a die into a strand; water-cooling or air-cooling the strand; and cutting the strand into pellets.

The additives may be mixed with the resin before being fed to the extruder, or may be fed from another feeder independently from the resin.

It is preferred that minor amounts of additives, such as particles and antioxidant, be mixed with the resin in advance to be uniformly dispersed.

It is preferred that the extruder have low shear force to facilitate pelletization at as low temperature as possible, thereby preventing deterioration of the resin (e.g., a reduction in molecular weight, tinting, and gel formation). For example, the biaxial extruder preferably should include deep-flighted screws rotating in the same direction. The screws should preferably be in mesh with each other to uniformly knead the composition.

The pellets resulting from the above-explained process are used to form a film. Alternatively, the powdered raw materials may be fed to the extruder from the feeder as they are without pelletization, to be used to form a film.

The resulting pellets are extruded from a uniaxial or biaxial extruder at a temperature between approximately 200° C. and 300° C., filtered through a filter such as leaf disk filter for removal of contaminants, and casted from a T-die into a film. The resulting film is nipped between a cooling roller and an elastic contact roller, and is solidified on the cooling roller.

It is preferred that the pellets be fed from a feed hopper to the extruder under vacuum or diminished pressure and under an inert atmosphere, to prevent oxidative decomposition.

It is preferred that the pellets be extruded at a stable rate with a gear pump, for example. The preferable filter for removal of contaminants is a stainless-steel sintered filter. The stainless-steel sintered filter is prepared by compressing complicatedly entangled stainless-steel fibers and sintering the fibers at the intersections for integration. A variation in the thickness of the fibers and/or the degree of compression can vary the density of the fibers, thereby adjusting the filtration accuracy.

The additives, such as plasticizer and particles, may be mixed with the resin in advance, or in the middle of the extruder. A mixer such as static mixer is preferably used to uniformly disperse the additives.

During the nipping of the film between the cooling roller and the elastic contact roller, the temperature of the film at the contact roller should preferably be controlled within the range of the glass transition temperature Tg of the film to Tg+110° C. Any roller having an elastic surface for the nipping process can be used.

The elastic contact roller is also termed pinching roller. Any commercially available elastic contact roller can be used.

The tension on the film should preferably be controlled during the removal of the film from the cooling roller, to prevent deformation of the film.

The film resulting from the melt casting should preferably be cooled on the cooling roller and then stretched through the above-explained stretching process.

The film may be stretched with any known roller stretcher or tenter. It is preferred that the film be stretched at a temperature from the glass transition temperature Tg of the resin in the film to Tg+60° C.

The pre-wound film may be trimmed at its sides into a desired width, and knurled (embossed) along the side edges to prevent scratches and adhesion between the rolled layers. The film may be knurled by heating or pressing with a metal ring having an uneven lateral surface. The side portions of the film, which were held by the clips, usually deform to an inappropriate level as a product. Such side portions are trimmed off to be reused.

<Physical Properties of λ/4 Retardation Film>

The thickness of the λ/4 retardation film according to the invention should not: be limited, but 10 to 250 μm. The thickness is preferably 10 to 100 μm, and more preferably 30 to 60 μm.

The λ/4 retardation film according to the invention has a width of 1 to 4 m. The width is preferably 1.4 to 4 m, and more preferably 1.6 to 3 m. A film having a width of larger than 4 m cannot be easily transported.

The arithmetic mean value of surface roughness Ra of the λ/4 retardation film according to the invention is preferably 2.0 to 4.0 nm, and more preferably 2.5 to 3.5 nm.

[Layer A]

The layer A according to the invention is disposed on at least one face of the λ/4 retardation film, and has a storage elastic modulus of 100 to 500 MPa. The layer A should preferably be disposed between the polarizer and the λ/4 retardation film.

(Component of Layer A)

Any material can be used for the layer A according to the invention, and a uv curable resin is preferred.

<Cationically Polymerizable Compound>

Particularly preferred uv curable resins in the present invention is cationically polymerizable compounds.

Any known cationically polymerizable compound or monomer can be used in the present invention. In particular, epoxy compounds and compounds having oxetane rings are preferred. Additionally vinyl ether compounds are preferably compounded.

<Epoxy Compound>

Examples of the monofunctional epxide usable in the present invention include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acrylyol oxymethylcyclohexene oxide, and 3-vinylcyclohexene oxide.

Examples of the polyfunctional epoxide include bisphenol A diglycidyl ether, bisphenol F diglycidyl ether, bisphenol S diglycidyl ether, bromobisphenol A diglycidyl ether, bromobisphenol F diglycidyl ether, bromobisphenol S diglycidyl ether, epoxynovorak resins, hydrogenated bisphenol A diglycidyl ether, hydrogenated bisphenol F diglycidyl ether, hydrogenated bisphenol S diglycidyl ether, 3,4-epoxycyclomethyl 3',4'-epoxycyclohexanecarboxylate, 2-(3,4-epoxycyclohexyl-5,5-spiro-3,4-epoxy)cyclohexane-meta-dioxane, bis(3,4-epoxycyclomethyl) adipate, vinylcyclohexene oxide, 4-vinylepoxycyclohexane, bis(3,4-epoxy-6-methylcyclohexylmethyl) adipate, 3,4-epoxy-6-methylcyclohexyl 3',4'-epoxy-6'-methylcyclohexane carboxylate, methylenebis(3,4-epoxycyclohexane), dicyclopentadiene diepoxide, di(3,4-epoxycyclomethyl)ether of ethylene glycol, ethylene bis(3,4-epoxycyclohexanecarboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

<Oxetane Compound>

Any known oxetane compound having an oxetane ring can be used, which is disclosed, for example, in Japanese Unexamined Patent Publication Nos. 2001-220526 and 2001-310937.

Examples of the oxetane compound used in the present invention include monofunctional oxetane compounds, such as 3-ethyl-3-hydroxymethyloxetane, 3-(meth)acryloxymethyl-3-ethyloxetane, (3-ethyl-3-oxetanylmethoxy)methylbenzene, 4-fluoro-[1-(3-ethyl-3-oxetanylmethoxy)methyl] benzene, 4-methoxy-[1-(3-ethyl-3-oxetanylmethoxy) methyl]benzene, [1-(3-ethyl-3-oxetanylmethoxy)ethyl] phenyl ether, isobutoxymethyl(3-ethyl-3-oxetanylmethyl) ether, isobornyloxyethyl(3-ethyl-3-oxetanylmethyl)ether, isobornyl(3-ethyl-3-oxetanylmethyl)ether, 2-ethylhexyl(3- ethyl-3-oxetanylmethyl)ether, ethyldiethylene glycol (3-ethyl-3-oxetanylmethyl)ether, dicyclopentadiene (3-ethyl-3 oxetanylmethyl)ether, dicyclopentenyloxyethyl (3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxymethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl(3-ethyl-3-oxetanylmethyl) ether.

Examples of the polyfunctional oxetane compound include 3,7-bis(3-oxetanyl)-5-oxa-nonane, 3,3'-(1,3-(2-methylenyl) propanediyl-bi (oxymethylene))bis-3-ethyloxetane), 1,4-bis [(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycolbis(3-ethyl-3-oxetanylmethyl)ether, tetraethylene glycolbis(3-ethyl-3-oxetanylmethyl)ether, tricyclodecanediyl dimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycolbis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone modified dipentaerythritol hexakis (3-ethyl-3-oxetanylmethyl) ether, caprolactone modified dipentaerythritol pentakis(3-ethyl-3-oxetanylmethyl)ether, ditrimethylolpropane tetrakis(3-ethyl-3-oxetanylmethyl) ether, EO modified bisphenol A bis(3-ethyl-3-oxetanylmethyl) ether, PO modified bisphenol A bis (3-ethyl-3-oxetanylmethyl) ether, EO modified hydrogenated bisphenol A bis(3-ethyl-3-oxetanylmethyl)ether, PO modified hydrogenated bisphenol A bis(3-ethyl-3-oxetanylmethyl)ether, and EO modified bisphenol F (3-ethyl-3-oxetanylmethyl)ether.

<Vinyl Ether Compounds>

The compound having a vinyl ether compound may be any known vinyl ether compound.

Examples of the monofunctional vinyl ether compound include methyl vinyl ether, ethyl vinyl ether, propyl vinyl ether, n-butyl vinyl ether, t-butyl vinyl ether, 2-ethyl hexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxymethyl vinyl ether, ethoxyethyl vinyl ether, butoxymethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chroroethoxyethyl vinyl ether, phenylethyl vinyl ether, and phenoxypolyethylene glycol vinyl ether.

Examples of polyfunctional vinyl ether compounds include divinyl ethers, such as ethylene glycol divinyl ether, polyethylene glycol divinyl ether, propylene glycol divinyl ether, butylene glycol vinivyl ether, hexanediol divinyl ether, bisphenol A alkylene oxide divinyl ether, and bisphenol F alkylene oxide divinyl ether; polyfunctional vinyl ethers, such as trimethylol ethane trivinyl ether, trimethylol propane trivinyl ether, ditrimethylol propane tetravinyl ether, glycerin trivinyl ether, pentaerythritol tetravinyl ether, dipentaerythritol pentavinyl ether, dipentaerythritol hexavinyl ether, ethylene oxide adduct of trimethylolpropane trivinyl ether, propylene oxide adduct of trimethylolpropane trivinyl ether, ethylene oxide adduct of ditrimethylolpropane tetravinyl ether, propylene oxide adduct of ditrimethylolpropane tetravinyl ether, ethylene oxide adduct of pentaerythritol tetravinyl ether, propylene oxide adduct of pentaerythritol tetravinyl ether, ethylene oxide adduct of dipentaerythritol hexavinyl ether, propylene oxide adduct of dipentaerythritol hexavinyl ether.

<Photopolymerization Initiator; Cationic Polymerization Initiator>

In order to form the layer A of the present invention, a photopolymerization initiator is used together with a cationically polymerizable compound. Any known photopolymerization initiator can used which is described in, for example, "UV•EB Koka Gijuts no Oyo to Shijo (Application and Market of UV/EB Curing Technology)" (published by CMC Publishing Co., Ltd., Edited by Rad Tech Japan, Editorial Supervisor: Tabata Yoneho).

Preferred photopolymerization initiators in the present invention are photo-acid-generating agents. Examples of the photo-acid-generating agent include chemically amplified photoresists and compounds used in photocationic polymerization (see "Imaging-yo Yuuki Zairyo (Organic Materials for Imaging)", Edited by The Japanese Research Association for Organic Electronics Materials, Published by Bunshin-Publishing (1993), pp. 187 to 192). Examples of compounds suitable for the present invention are listed below:

The first group includes salts of aromatic onium compounds, such as diazonium, ammonium, iodonium, sulfonium, and phosphonium, with $B(C_6F_5)_4^-$, $PF_6^-$, $AsF_6^-$, $SbF_6^-$, $CF_3SO_3^-$. Preferred onium salts are sulfonium and iodonium salts.

The second groups include sulfone compounds that can generate sulfonic acid. The third group includes halogenated compounds that can generate hydrogen halide. The fourth group includes iron-allene complexes.

In a cationically polymerizable composition used for formation of the layer A of the present invention, preferred photo-acid generators are compounds containing triaryl sulfonium salts.

(Additive for Layer a)

The layer A of the present invention may contain various additives in amounts that do not affect the storage elastic modulus. Preferred examples of such additives include plasticizers, polyvalent alcohol esters, uv absorbing agents, discoid compounds, phosphorus flame retardants, matting agent, which are described in the section of the λ/4 retardation film.

It is preferred that low boiling point organic solvents be not used such as alcohols, ketones, or polyvalent alcohols for preparation of the coating solution for a layer A. If the coating solution for a layer A contains a low boiling point organic solvent, the coating solution applied on to a λ/4 retardation film is diffused into the λ/4 retardation film to cause swelling, shrinkage, or expansion of the λ/4 retardation film, which phenomena may results in poor planarity of the λ/4 retardation film.

(Formation of Layer a)

Preferred examples of coating process for forming a layer A with a coating solution for a layer A on a λ/4 retardation film include wet coating processes, such as spin coating, dip coating, extrusion coating, roller coating, spray coating, gravure coating, wire-bar coating, and air-knife coating.

The layer A formed on the λ/4 retardation film by such a coating process is irradiated with uv rays for curing.

The irradiation means used for uv irradiation is provided with a uv lamp that can emit stable uv light having a specific wavelength region and a filter that can transmit uv light having a specific wavelength region. Examples of the uv lamp include a mercury lamp, a metal halide lamp, an electrodeless lamp, an excimer laser, a uv laser, a cold cathode tube, a hot cathode tube, a black light, and an LED (light emitting diode).

(Characteristic Value of Layer A and Method of Controlling Value)

<Storage Elastic Modulus>

The layer A of the present invention is characterized by having a storage elastic modulus within the range of 100 to 500 MPa, preferably 130 to 400 MPa, more preferably 150 to 300 MPa.

The storage elastic modulus in the present invention is determined by a dynamic viscoelastic measurement, specifically by the following method of determining the storage elastic modulus.

The storage elastic modulus of the layer A is determined as follows: A coating solution for a layer A is applied onto a polyethylene terephthalate (PET) film support. The resulting thin film A was removed from the PET support and the storage elastic modulus of the layer A at 25° C. was determined at a heating mode (heating rate: 5° C./min, frequency: 10 Hz) with a rheometer ARES made by by Rheometric Scientific, Inc.

The storage elastic modulus of the layer A of the present invention may be controlled within a range of 100 to 500 MPa through the selection of type of the cationically polymerizable compound (particularly, selection of monofunctional or polyfunctional polymerizable compound), the type of cationic polymerization initiator, the type and amount of the additive, the type of light source for curing, and the intensity of illuminating light. A desirable storage elastic modulus can be achieved by an optimal combination of these parameters. A high storage elastic modulus of the layer A can be achieved by selection of a compound having a higher functionality as a cationically polymerizable compound, a reduction in additive, and severe curing conditions (intensity and time of irradiation).

<UV Absorbability>

The layer A of the present invention preferably has a spectral absorption characteristic, i.e., a maximum absorption wavelength (λmax) in a uv region in the range of 200 to 400 nm.

A layer A having such a uv absorption characteristic can reduce uv light to enter the organic electroluminescent element from the viewer side and thus can impart high light resistance (uv resistance) to the element.

The spectral absorption characteristic of the present invention is determined as follows: A coating solution for a layer A is applied onto a polyethylene terephthalate film support. The resulting thin film A is separated from the PET support and the spectral transmittance of the film A was measured over 200 nm to 800 nm with a spectrophotometer U-4000 made by made by Hitachi, Ltd. to confirm a maximum absorbance (λmax) within the uv wavelength range of 200 to 400 nm.

In the present invention, desirable uv absorption characteristics are imparted to the layer A through selection of uv curable resins for forming the layer A, specifically selections of a cationically polymerizable compound and a cation polymerization initiator, and addition of an optional uv absorbing agent.

[Layer B]

The layer B of the present invention is disposed between the protective film and the polarizer. Its storage elastic modulus is preferably less than that of the layer A of the invention. The preferred storage elastic modulus of the layer B is preferably less than about 500 MPa, although depending on the storage elastic modulus of the layer A.

(Material for Layer B)

The layer B of the present invention may be any material. For example, materials used in the layer A may also be appropriately used to achieve a desirable storage elastic modulus.

(Additive for Layer B)

The layer B of the present invention may contain various additives depending on the purpose of the present invention. Examples of such an additive include plasticizers, polyvalent alcohol esters, uv absorbers, discoid compounds, phosphorus flame retardants, and matting agents, which are described in the section of the λ/4 retardation film.

(Method of forming layer B)

The layer B of the present invention is formed with a coating solution for a layer B. The layer B is preferably formed by a wet coating process. Examples of the wet coating process include spin coating, dip coating, extrusion coating roller coating, spray coating, gravure coating, wire-bar coating, and air-knife coating.

[Other Layers of Circularly Polarizing Plate]

(Surface Anti-Reflective Layer)

The protective film of the circularly polarizing plate is preferably provided with a surface anti-reflective layer 11 (in FIG. 1) disposed directly or via any other layer to prevent reflectance of external light.

The surface anti-reflective layer is preferably a laminate of sublayers of which the refractive indices, thicknesses, number, order are appropriately adjusted to reduce the reflectance by optical interference. The surface anti-reflective layer preferably includes a single low-refractive sublayer having a refractive index lower than that of the support, or a combination of a high refractive sublayer having a refractive index higher than that of the support and a low refractive sublayer. Particularly preferred are multilayer surface anti-reflective layers having three or more refractive sublayers. In a preferred embodiment, three layers having different refractive indices, i.e., a medium refractive sublayer (having a refractive index higher than that of the support and lower than that of the high refractive sublayer), a high refractive sublayer, and a low refractive sublayer are deposited in sequence from the substrate. Alternatively, a surface anti-reflective layer having four or more sublayers, i.e., two or more high refractive sublayers and two or more low refractive sublayers which are alternately deposited is preferred. Nonlimiting exemplary configurations of the surface anti-reflective layer are as follows:

Protective film/low refractive sublayer

Protective film/medium refractive sublayer/low refractive sublayer

Protective film/medium refractive sublayer/high refractive sublayer/low refractive sublayer Protective film/high refractive sublayer (conductive layer)/low refractive sublayer <Low Refractive Layer>

An essential feature of the surface reflective layer is a low refractive layer. Thus the layer preferably contains fine silica particles. The layer has a refractive index less than that of a substrate film and preferably has a refractive index in the range of 1.30 to 1.45 at 23° C. and a wavelength of 550 nm.

The low refractive layer has a thickness in the range of preferably 5 to 500 nm, more preferably 10 to 300 nm, most preferably 30 to 200 nm.

A composition for a low refractive layer preferably contains at least one porous or hollow silica particle having an outer shell. In particular, hollow silica particles having outer shells are preferred.

The composition for a low refractive layer preferably contains an organosilicon compound represented by Formula (OSi-1) or a hydrolyzate or polycondensation product thereof:

$$Si(OR)_4 \qquad \text{Formula (OSi-1)}$$

where R is a $C_1$ to $C_4$ alkyl groups. Specific examples of the organosilicon compound include tetramethoxysilane, tetraethoxysilane, and tetraisopropoxysilane.

Organic solvents, silane coupling agents, hardening agents, and surfactants may also be added if necessary.

<High Refractive Layer>

The refractive index of the high refractive layer should preferably be controlled within a range of 1.4 to 2.2 that is determined under conditions of 23° C. and a wavelength of 550 nm. The high refractive layer has a thickness of preferably 5 nm to 1 μm, more preferably 10 to 200 nm, most preferably 30 to 100 nm. A desirable refractive index can be achieved by addition of metal oxide fine particles, for example. The metal oxide fine particles have a refractive index of preferably 1.80 to 2.60, more preferably 1.85 to 2.50.

Any metal oxide fine particles may be used to form a high refractive layer. The metal oxide fine particles may be composed of at least one metal element selected from the group consisting of Ti, Zr, Sn, Sb, Cu, Fe, Mn, Pb, Cd, As, Cr, Hg, Zn, Al, Mg, Si, P, and S. The surfaces of the metal oxide fine particles may be doped with a trace amount of dopant element such as Al, In, Sn, Sb, Nb, halogen, Ta, or a combination thereof. In a preferred embodiment of the present invention, metal oxide fine particles composed of at least one element selected from zirconium oxide, antimony oxide, tin oxide, zinc oxide indium-tin oxide (ITO), antimony-doped tin oxide (ATO), and zinc antimonate. Zinc antimonite is particularly preferred.

The metal oxide fine particles have an average primary diameter of preferably 10 to 200 nm, more preferably 10 to 150 nm. The average diameter of the metal oxide particles can be determined with a scanning electron microscopic (SEM) photographs, for example. Alternatively the average diameter may be determined with a particle size analyzer utilizing dynamic or static light scattering. Particles having an average diameter of 10 nm or more barely aggregate and thus have high dispersibility. Particles having an average diameter of 200 nm or less do not increase the haze. Preferred shapes of the metal oxide fine particles are oval, spherical, cubic, tactoid, acicular, and amorphous.

The surfaces of the metal oxide fine particles may be treated with any organic compound. The surface modified metal oxide fine particles have improved dispersion stability in organic solvents, resulting in ready size control of dispersed particles without coagulation or sedimentation over time. The amount of the organic modifier on the surfaces of particles is in the range of preferably 0.1 to 5 mass %, more preferably 0.5 to 3 mass % of the metal oxide fine particles.

Examples of the organic compound used for the surface treatment include polyols, alkanolamines, stearic acid, silane coupling agents, and titanate coupling agents. Among them preferred are silane coupling agents. These surface treating agents may be used in combination.

The high refractive layer may contain n-conjugated conductive polymers. The n-conjugated conductive polymers may be any organic polymer having n-conjugated main chains. Examples of such polymers include polythiophenes, polypyrroles, polyanilines, polyphenylenes, polyacetylenes, polyphenylene vinylene, polyacenes, polythiophene vinylenes, and copolymer thereof. Preferred are polythiophenes, polyanilines, and polyacetylenes in view of ready polymerization and high stability.

Although unsubstituted π-conjugated conductive polymers have sufficient conductivity and solubility in binder resins, functional groups may be introduced in order to enhance the conductivity and solubility. Examples of such functional groups include alkyl groups, carboxy group, sulfo group, alkoxy groups, hydroxy group, and cyano group. The polymer may also contain any ionic compound. Examples of the ionic compound include imidazoliums, pyridiums, alicyclic amines, aliphatic phosphonium cations and inorganic anions such as $BF^{4-}$, $PF^{6-}$, $CF_3SO_2^-$, and fluorine-based anions such as $(CF_3SO_2)_2N^-$ and $CF_3CO_2^-$. The proportion of the binder to the polymer is preferably 10 to 400 parts by mass, more preferably 100 to 200 parts by mass to 100 parts by mass of polymer.

<<Organic Electroluminescent Element>>

Individual components of the organic electroluminescent element included in the organic EL display device of the present invention will now be described.

With reference to FIGS. 1 and 2, the organic EL element B according to the present invention includes, in sequence, a substrate 101 of for example, glass or polyimide, a metal electrode 102, an organic luminescent layer 103, a transparent electrode (for example, ITO) 104, an insulating layer 105, a sealing layer 106, and a film 107 (omittable). The organic luminescent layer 104 includes a hole injection layer, a hole transport layer, a luminescent layer, and an electron transport layer, for example.

[Substrate]

The substrate 101 usable in organic EL display devices depicted in FIGS. 1 and 2 may be composed of any type of glass or plastic material and may be transparent or opaque. For light emission from the substrate 1, the substrate 1 should preferably be transparent. Preferred examples of the transparent substrate include glass, quartz, and transparent resin films.

(Resin Film)

Examples of the resin film include polyesters, such as polyethylene terephthalate (PET) and polyethylene naphthalate (PEN); polyuethylene; polypropylene; cellulose esters and derivatives thereof, such as cellophane; cellulose acetate (DAC), cellulose triacetate (TAC), cellulose acetate butyrate, cellulose acetate propionate (CAP), cellulose acetate phthalate, and cellulose nitrate; poly(vinylidene chloride); poly (vinyl alcohol); polyethylene-vinyl alcohol; syndiotactic polystyrene; polycarbonates; norbornene resins; polymethylpentene; polyether ketones; polyimides; polyether sulfones (PESs); polyphenylene sulfide; polysulfones; polyether imides; polyether ketone imides; polyamides; fluorinated resins, nylons, poly(methyl methacrylate); acrylics; polyarylates; and cycloolefin resins, such as Arton (commercial name, available from JSR) and Apel (commercial name, available from Mitsui Chemicals, Inc.).

The resin film may be covered with an inorganic, organic, or organic-inorganic hybrid barrier film. The barrier film should preferably has high barrier characteristics satisfying a water vapor permeability of 0.01 g/(m²·24 h·atm) or less determined at a temperature of 25±0.5° C. and a relative humidity of 90±2% RH) in accordance with JIS K 7129-1992 and an oxygen permeability of $1 \times 10^{-3}$ ml/(m²·24 h·atm) or less and a water vapor permeability of $1 \times 10^{-5}$ g/(m²·24 h·atm) or less that were determined in accordance with JIS K 7126-1987.

The barrier film may be composed of any material that can block the intrusion of aging components such as moisture and oxygen. Examples of such a material include silicon monoxide, silicon dioxide, and silicon nitride. In order to solve the brittleness of the film, the barrier film preferably should have a laminated structure including at least one inorganic layer of these silicon compounds and at least one organic layer. The inorganic layers and organic layers can be disposed in any order in the laminate. Several inorganic layers and organic layers should preferably be laminated alternately.

The barrier film may be formed by any known process, for example, vacuum deposition, sputtering, reactive sputtering, molecular beam epitaxy, cluster ion beaming, ion plating, plasma polymerization, atmospheric plasma polymerization, plasma-enhanced CVD, laser CVD, thermal CVD, or coating. Preferred is atmospheric plasma polymerization, as is disclosed in Japanese Unexamined Patent Publication No. 2004-68143, which can form precise thin-layers.

Examples of the opaque substrate include plates of metals such as aluminum and stainless steel, opaque resin films and plates, and ceramic plates.

(Glass Plate)

The substrate should preferably be a glass plate that can prevent warpage of the organic luminescent display device. The glass plate has a preferred thickness in the range of 0.1 to 10 mm. A thickness of 0.1 mm or more ensures high durability without damage by small impact during transfer or in use and exhibits high visibility due to no thermal warpage or crack. A thickness of 10 mm or less contributes to reductions in weight of the organic electroluminescent display device and production cost.

[Metal Electrode]

Materials for the metal electrode (also referred to as anode) includes compounds having a large work function from the vacuum level, such as metals, e.g. aluminum (Al), chromium (Cr), molybdenum (Mo), tungsten (W), copper (Cu), silver (Ag), gold (Au), alloys of these metals, and oxides of these metals and alloys; alloy of tin oxide ($SnO_2$) and antimony (Sb), indium tin oxide (ITO), indium zinc oxide (InZnO), alloy of zinc oxide (ZnO) and aluminum (Al), in order to inject holes at high efficiency. These oxides of the metals and alloys may be used alone or in combination.

Alternatively, the anode may have a laminated structure including a first layer having high light reflectance and an overlying second layer having high light transmittance and a large work function.

For example, the first layer is composed of an aluminum alloy containing at least one auxiliary element having a work function smaller than that of the main component aluminum. Examples of the auxiliary element include lanthanoid elements. Although the lanthanoid elements do not have large work functions, they can improve the stability of the anode and satisfy the hole injection characteristics. The anode may also contain other auxiliary elements such as silicon (Si) and copper (Cu), in addition to the lanthanoid elements.

The total content of auxiliary components in the first layer or aluminum alloy layer should preferably be 10 mass % or less for Nd, Ni, and Ti, which contribute to stabilization of aluminum. Such a composition can maintain the reflectance of the aluminum alloy layer, stabilize the aluminum alloy layer during a production process of organic electroluminescent elements, and ensure high processing accuracy and chemical stability. The composition can also improve the conductivity of the anode (metal electrode) 102 and adhesiveness to the substrate 101.

The second layer is composed of at least one of oxides of aluminum alloys, molybdenum oxide, zirconium oxide, chromium oxide, and tantalum oxide, for example. A second layer that is an aluminum alloy oxide (including a spontaneous oxide layer) containing a lanthanoid element as an auxiliary component has high light transmittance due to high transmittance of the lanthanoid element. This composition can maintain high reflectance at the surface of the first layer. The second layer may be a transparent conductive layer composed of indium tin oxide (ITO) or indium zinc oxide (IZO), for example. The conductive layer can enhance electron injection characteristics of the anode.

The anode may be provided with a conductive layer on a side to be contact with the substrate in order to enhance adhesion of the anode to the substrate. Examples of such a conductive layer include transparent conductive layers composed of ITO and IZO.

[Organic Luminescent Layer]

(Hole Injection Layer/Hole Transport Layer)

The hole injection layer and the hole transport layer enhance the efficiency of holes injected into the luminescent layer. Examples of the material for the hole injection layer and hole transport layer include benzidine, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazone, stilbene, and derivatives thereof; polysilane compounds; and heterocyclic conjugated monomers, oligomers, and polymers, such as vinylcarbazole and thiophene compounds.

Specific examples of the material for the hole injection layer and hole transport layer include, but should not be limited to, α-naphthylphenylenediamine, porphyrin, metal tetraphenylporphyrin, metal naphthalocyanine, hexaazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(p-phenylene vinylene), poly(thiophenevinylene), and poly(2,2'-thienylpyrole).

(Luminescent Layer)

The luminescent layer is a region generating luminescence by recombination of holes injected from the anode and electrons injected from the transparent electrode (cathode). The luminescent layer may be a thin organic film composed of only carbon and hydrogen atoms or composed of a compound having tertiary amino group having hole transportability in its molecule. Alternatively, the luminescent layer may be a thin mixed organic film containing a trace amount of organic dopant such as a perylene derivative, a coumalin derivative, a pyran dye, and a triphenylamine derivative. In this case, the luminescent layer is usually formed by codeposition of a host material (main component) of the luminescent layer and a dopant material. Among materials having tertiary amino groups having hole transportability in their molecules, ones exhibiting low intermolecular interaction and less concentration quenching function as optimum dopants which can be compounded in high content.

The materials for the luminescent layer can be appropriately selected according to required luminescent color. For example, usable materials for blue luminescence are oxadiazole derivatives, cyclopentadiene derivatives, pyrazoloquinoline derivatives, distyrylarylene derivatives, and oligothiophene derivatives. For green luminescent color, blue luminescent layers may be used which doped with known green dyes, such as coumalin derivatives such as coumalin 6 and quinacridone derivatives. For red luminescent color, blue or green luminescent layers may be used which doped with known red dyes such as Neil Red, pyrane derivatives such as 4-(dicyanomethylene)-2-methyl-6 (p-dimethylaminostyryl)-4H-pyrane (DCM1), 4-(dicyanomethylene)-2-t-butyl-6-(julolidylstyryl)-pyrane (DCJT), squarylium derivatives, porphyrin derivatives, chlorin derivatives, and julolidine derivatives.

The luminescent layer may be a white luminescent layer including a red luminescent sublayer, a green luminescent sublayer, and a blue luminescent sublayer, or may have a tandem structure including two or more luminescent sublayers laminated with connection sublayers. Alternatively, the luminescent layer may be an electron portable luminescent layer, which also functions as an electron transport layer, or a hole transportable luminescent layer.

(Electron Transport Layer)

The electron transport layer transports electrons injected from the transparent electrode 104 (also referred to as cathode) to a luminescent layer. Examples of materials for the electron transport layer include quinoline, perylene, phenanthroline, bisastyryl, pyrazine, triazole, oxazole, oxadiazole, fluorenone, and derivatives and metal complexes thereof. Specific examples include aluminum tris(8-hydroquinoline) (abbreviated as Alq₃), anthracene, naphthalene, phenanthrene, pyrene, anthracene, perylene, butadiene, coumalin, acridine, stilbene, 1,10-phenanthroline, and derivatives and metal complexes thereof.

The luminescent layer may have any other configuration that is provided with an adjoining electron transport layer and any other layer, if necessary.

The luminescent layer may be provided in the organic EL element B in the form of hole-transportable luminescent layer, electron-transportable luminescent layer, or hole and electron transportable luminescent layer. The individual layers, such as the hole injection layer, the hole transport layer, the luminescent layer, and the electron transport layer in the organic luminescent layer 103 may each have a multilayer configuration composed of two or more sublayers.

[Transparent Electrode: Cathode]

A transparent electrode 104 (also referred to as cathode) is provided on the organic luminescent layer 103 having such a configuration.

The transparent electrode 104 (also referred to as cathode) is composed of a material having a small work function and high light transmittance. Examples of such a material include oxide of lithium (Li) or lithium oxide (Li₂O), carbonate of cesium (Cs) or cesium carbonate (Cs₂CO₃), and mixtures of the oxide and the compound oxide. The transparent electrode 104 (referred to as cathode) may be composed of any other material. Examples of the material include alkaline earth metals, such as calcium (Ca) and barium (Ba); alkali metals, such as lithium and cesium; metals having a low work function, such as indium (In) and magnesium (Mg); and oxides, compound oxides, and fluorides of these metals; which may be used alone or in the form of mixtures and alloys of these metals, oxides, compound oxides, and fluorides, which have high stability.

EXAMPLES

The present invention will now be described in detail by way of examples. The present invention should not be limited to these examples. In the examples, "part (s)" and "%" indicate "parts by mass" and "mass %", respectively, unless otherwise indicated.

<<Pretreatment and Preparation of λ/4 Retardation Film>>

[λ/4 Retardation Film 1]

A film WRS available from Teijin Limited was relaxed and stretched such that the retardation Ro(550) at 550 nm was 138 nm to give a λ/4 retardation film 1.

[λ/4 Retardation Film 2]

A film Esushina made by Sekisui Chemical Co., Ltd. was relaxed and stretched such that the retardation Ro(550) at 550 nm was 138 nm to give a λ/4 retardation film 1.

[λ/4 Retardation Film 3]

A λ/4 retardation film 3 was prepared as follows:

(Preparation of Cellulose Acylate)

<Synthesis of Cellulose Acylate>

Acetic acid (1100 g) and propionic acid (250 g) were added to cellulose (280 g, dissolving pulp available from Nippon Paper Industries Co., Ltd.) and the mixture was agitated at 54° C. for 40 minutes. After the mixture was cooled, cooled acetic anhydride (300 g), propionic anhydride (600 g), and sulfuric acid (12 g) were added on an ice bath for esterification. During the esterification, the mixture was agitated 200 minutes while the liquid temperature was controlled so as not to exceed 40° C. After the reaction, a mixture of acetic acid (300 g) and water (100 g) was added dropwise over 20 minutes to hydrolyze excess anhydrides. While the solution was maintained at 40° C., acetic acid (900 g) and water (300 g) were added followed by agitation for one hour. The mixture was added to an aqueous magnesium acetate (20 g) solution, was agitated for a while, was filtered, and was dried to give cellulose acylate. The resulting cellulose acylate had a total degree of acyl group of 2.6, a degree of substitution of propionyl group (carbon number: 3) of 0.7, a degree of substitution of acetyl group of 1.9, and a weight average molecular weight of 220000. The degrees of substitution of the total acyl group and propionyl group (carbon number: 3) were determined in accordance with ASTM D-817-91.

(Synthesis of Sugar Ester Compound A)

The sugar ester compound A was prepared as follows:

[Chemical Formula 1]

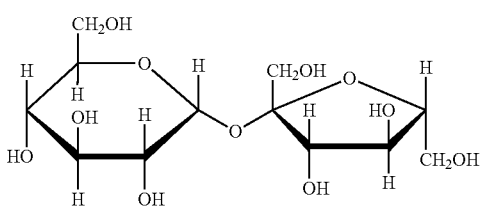
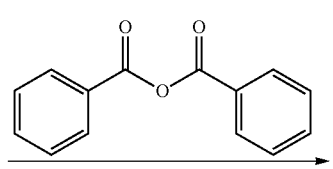

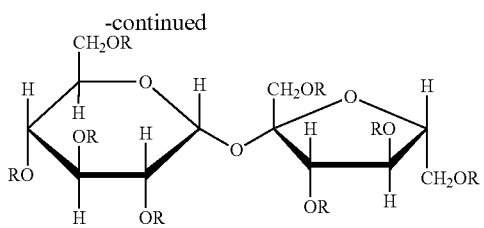

-continued

R (The number of substitutions)

Example compound A-1 (0) —N, (8) —C(=O)—C₆H₅

Example compound A-2 (1) —H, (7) —C(=O)—C₆H₅

Example compound A-3 (2) —H, (6) —C(=O)—C₆H₅

Example compound A-4 (3) —H, (5) —C(=O)—C₆H₅

Example compound A-5 (4) —H, (4) —C(=O)—C₆H₅

Into a four-necked round-bottom flask provided with an agitator, a ref lux condenser, a thermometer, and a nitrogen inlet tube was fed sucrose 34.2 g (0.1 mol), benzoic anhydride 180.8 g (0.6 mol), and pyridine 379.7 g (4.8 mol). The flask was heated with agitation at 70° C. for 5 hours while the solution was bubbled with gaseous nitrogen from the inlet tube to complete esterification reaction. The flask was evacuated to $4\times10^2$ Pa or less, excess pyridine was distilled out at 60° C., the flask was evacuated to $1.3\times10$ Pa or less and then heated to 120° C. to distill out most of the residual benzoic anhydride and benzoic acid formed. A toluene layer prepared by phase separation was washed with 100 g of water at room temperature for 30 minutes, the toluene layer was separated, and toluene was distilled out at 60° C. under a reduced pressure ($4\times10^2$ Pa or less). A mixture of compounds A-1, A-2, A-3, A-4, and A-5 was prepared.

The mixture was analyzed by HPLC and LC-MASS. The mixture contained 1.3 mass % A-1, 13.4 mass % A-2, 13.1 mass % A-3, 31.7 mass % A-4, and 40.5 mass % A-5. The average degree of substation was 5.5.

Conditions for HPLC-MS were as follows:
1) LC Unit
Instrument: column oven JASCO CO-965, detector JASCO UV-970 240 nm), pump JASCO PU-980, degaser JASCO DG-980-50
Column: Inertsil ODS-3, particle diameter 5 μm, 4.6 by 250 mm (made by GL Science)
Column temperature: 40° C.
Flow rate: 1 ml/min
Mobile phase: tetrahydrofuran (1% acetic acid):$H_2O$ (50:50)
Injected volume: 3 μl
2) MS Unit
instrument: LCQ DECA (made by Thermo Quest)
Ionization: electrospray ionization (ESI)
Spray Voltage: 5 kV
Capillary temperature: 180° C.
Vaporizer temperature: 450° C.
(Preparation of Fine Particle Dispersion)
<Preparation of Fine Particle Dispersion 1>

| | |
|---|---|
| Fine particles (Aerosil R972V available from Nippon Aerosil Co., Ltd. | 11 parts by mass |
| Ethanol | 89 parts by mass |

The mixture was agitated for 50 minutes in a dissolver and was dispersed with a Manton-Gaulin homonegizer.
<Preparation of Fine Particle Dispersion 1>
The fine particle dispersion 1 was gradually added with stirring in a dissolution vessel filled with methylene chloride. The system was dispersed with an attritor until the secondary particles have a predetermined particle size. The dispersion was filtered through a filter, FINE MET NF, available from Nippon Seisen Co., Ltd. to give fine particle dispersion 1.

| | |
|---|---|
| Methylene chloride | 99 parts by mass |
| Fine particle dispersion 1 | 5 parts by mass |

(Primary Dope)
A primary dope was prepared according to the following formulation.

A mixed solvent of methylene chloride and ethanol was placed into a pressure dissolution vessel. The cellulose acylate prepared as described above was added with stirring to the vessel. The vessel was heated with stirring to completely dissolve the solute. The solution was filtered through filter paper NO. 244 made by Azumi Filter Paper Co., Ltd to give a primary dope.

The sugar ester compound 1 and cellulose acylate 1 prepared by Synthetic Examples described above were used.

<Composition of Primary Dope>

| | |
|---|---|
| Methylene chloride | 340 parts by mass |
| Ethanol | 64 parts by mass |
| Cellulose acylate (Total degree of acyl substitution: 2.6, degree of propionyl substitution: 0.7, degree of acetyl substitution: 1.9, weight average molecular weight: 220000) | 100 parts by mass |
| Sugar ester compound A | 5.0 parts by mass |
| Fine particle dispersion 1 | 1.0 parts by mass |

(Preparation of Film)

The resulting primary dope was uniformly cast onto a stainless steel belt support of an endless belt casting apparatus.

The solvent was evaporated on the stainless steel belt support until the residual solvent content in the film decreased to 75 mass %, and the film was separated from the stainless steel belt support. The separated cellulose ester film was stretched in the width direction with a tenter under applied heat. The film was conveyed to be dried on multiple rollers in a drying zone. Its ends pinched with tenter clips were then trimmed with a laser cutter and the film was rewound. The film was obliquely stretched to a draw ratio of 2.0 times at 185° C. to give a λ/4 retardation film 3. The λ/4 retardation film 3 had an in-plane retardation Ro(550) of 138 nm.

<<Preparation of Circularly Polarizing Plate>>
[Polarization of Circularly Polarizing Plate 1]
(Preparation of Polarizer)

A 70 μm thick polyvinyl alcohol film was swelled in water at 35° C. The film was dipped in a solution of iodine (0.075 g) and potassium iodide (5 g) in water (100 g) for 60 seconds and then dipped in a solution of potassium iodide (3 g) and boric acid (7.5 g) in water (100 g) at 45° C. The film was uniaxially stretched at a draw ratio of five times at 55° C. The uniaxially stretched film was washed with water and dried to give a polarizer with a thickness of 20 μm.

(Preparation of Coating Solution for Layer A1)

The following components were mixed and deaerated to prepare a coating solution for a layer A1. Triallysulfonium hexafluorophosphate was compounded in a form of a 50% solution in propylene carbonate. The following formulation indicates the solid content of triallysulfonium hexafluorophosphate.

<Composition of Coating Solution for Layer A1>

| | |
|---|---|
| 3,4-Epoxycyclomethyl 3,4-epoxycyclohexanecarboxylate | 65 parts by mass |
| EPOLEAD GT-301 (alicyclic epoxy resin available from Daicel Corporation) | 20 parts by mass |
| 1,4-Butanediol diglycidyl ether | 15 parts by mass |
| Triallysulfonium hexafluorophosphate | 2.25 parts by mass |
| 9,10-Dibutoxyanthrathene | 0.1 parts by mass |
| 1,4-Diethoxynaphthalene | 2.0 parts by mass |

(Preparation of Polarizing Plate)

A protective film KC4UA (available from Konica Minolta Advanced Layers, Inc.) was prepared and a polarizing plate was fabricated as follows:

1) The KC4UA film was dipped in an aqueous 2 mol/L sodium hydroxide solution at 60° C. for 90 seconds, was washed with water, and then dried. A surface, to be bonded to the polarizer, of the film was saponified.

2) The polarizer was dipped in a 2 mass % (solid content) polyvinyl alcohol adhesive solution for 1 to 2 seconds.

3) The excess adhesive on the polarizer was wiped gently off and was placed onto the KC4UA film treated in step 1).

4) The polarizer was bonded to the protective film KC4UA at a transfer rate of about 2 m/min under a pressure of 20 to 30 N/cm².

5) The bonded sample of the polarizer and the film KC4UA was sandwiched between two sheets of paper and then between thick glass plates. In this state, the bonded sample was left for one day at 23° C. and 55% RH under a load of weight to prepare a polarizing plate.

(Formation of Layer A1)

A surface of the λ/4 retardation film 1 was treated by corona discharge. The coating solution for forming a layer A1 was applied onto the treated surface of the λ/4 retardation film 1 with a bar coater into a cured thickness of about 3.0 μm to form a layer A1. The resulting layer A1 was bonded to the polarizer face of the polarizing plate prepared as described above and was cured with uv rays from a uv irradiation device provided with a belt conveyor (lamp: D bulb, made by Fusion UV Systems) in an accumulated light intensity of 750 mJ/cm² to prepare a circularly polarizing plate 1.

The storage elastic modulus of the layer A determined by the procedure described below was 90 MPa.

[Preparation of Circularly Polarizing Plates 2 to 15]

Circularly polarizing plate 2 to 15 were prepared as in the circularly polarizing plate 1 except that the type of the λ/4 retardation film, the presence of the layer A, the type of the coating solution for the layer A (described below), and the curing condition (the intensity of uv irradiation, described below) were varied to adjust the storage elastic modulus as shown in Table 1.

The layers A2 to A6 used for preparation of each circularly polarizing plate were prepared as follows:

(Conditions for Forming Layer A2: Storage Elastic Modulus=100 MPa)

The layer A2 was formed as in the method for forming the layer A1 used for preparation of the circularly polarizing plate 1 except that the composition of the coating solution for forming the layer A and the accumulated intensity of uv light for curing the layer A were modified as follows:

<Composition of Coating Layer for Layer A2>

| | |
|---|---|
| 3,4-Rpoxycyclomethyl 3,4-epoxycyclohexanecarboxylate | 63 parts by mass |
| EPOLEAD GT-301 (alicyclic epoxy resin available from Daicel Corporation) | 22 parts by mass |
| 1,4-Butanediol diglycidyl ether | 15 parts by mass |
| Triallysulfonium hexafluorophosphate | 2.40 parts by mass |
| 9,10-Dibutoxyanthrathene | 0.1 parts by mass |
| 1,4-Diethoxynaphthalene | 2.0 parts by mass |

<Condition for Uv Irradiation>

The layer A2 was cured with uv rays from a uv irradiation device provided with a belt conveyor (lamp: D bulb, made by Fusion UV Systems) in an accumulated light intensity of 800 mJ/cm².

(Conditions for forming layer A3: storage elastic modulus=150 MPa)

The layer A3 was formed as in the method for forming the layer A1 used for preparation of the circularly polarizing plate 1 except that the composition of the coating solution for forming the layer A and the accumulated intensity of uv light for curing the layer A were modified as follows.

<Composition of Coating Layer for Layer A3>

| | |
|---|---|
| 3,4-Epoxycyclomethyl 3,4-epoxycyclohexanecarboxylate | 57 parts by mass |
| EPOLEAD GT-301 (alicyclic epoxy resin available from Daicel Corporation) | 28 parts by mass |
| 1,4-Butanediol diglycidyl ether | 15 parts by mass |
| Triallysulfonium hexafluorophosphate | 3.30 parts by mass |
| 9,10-Dibutoxyanthrathene | 0.1 parts by mass |
| 1,4-Diethoxynaphthalene | 2.0 parts by mass |

<Condition for uv Irradiation>

The layer A3 was cured with uv rays from a uv irradiation device provided with a belt conveyor (lamp; D bulb, made by Fusion UV Systems) in an accumulated light intensity of 1100 mJ/cm$^2$.

(Conditions for Forming Layer A4: Storage Elastic Modulus=180 MPa)

The layer A4 was formed as in the method for forming the layer A1 used for preparation of the circularly polarizing plate 1 except that the composition of the coating solution for forming the layer A and the accumulated intensity of uv light for curing the layer A were modified as follows:

<Composition of Coating Layer for Layer A4>

| | |
|---|---|
| 3,4-Epoxycyclomethyl 3,4-epoxycyclohexanecarboxylate | 50 parts by mass |
| EPOLEAD GT-301 (alicyclic epoxy resin available from Daicel Corporation) | 35 parts by mass |
| 1,4-Butanediol diglycidyl ether | 15 parts by mass |
| Triallysulfonium hexafluorophosphate | 3.50 parts by mass |
| 9,10-Dibutoxyanthrathene | 0.1 parts by mass |
| 1,4-Diethoxynaphthalene | 2.0 parts by mass |

<Condition for uv Irradiation>

The layer A4 was cured with uv rays from a uv irradiation device provided with a belt conveyor (lamp: D bulb, made by Fusion UV Systems) in an accumulated light intensity of 1400 mJ/cm$^2$.

(Conditions for Forming Layer A5: Storage Elastic Modulus=500 MPa)

The layer A5 was formed as in the method for forming the layer A1 used for preparation of the circularly polarizing plate 1 except that the composition of the coating solution for forming the layer A and the accumulated intensity of uv light for curing the layer A were modified as follows:

<Composition of Coating Solution for Layer A5>

| | |
|---|---|
| 3,4-Epoxycyclomethyl 3,4-epoxycyclohexanecarboxylate | 25 parts by mass |
| EPOLEAD GT-301 (alicyclic epoxy resin available from Daicel Corporation) | 60 parts by mass |
| 1,4-Butanediol diglycidyl ether | 15 parts by mass |
| Triallysulfonium hexafluorophosphate | 4.00 parts by mass |
| 9,10Dibutoxyanthrathene | 0.1 parts by mass |
| 1,4-Diethoxynaphthalene | 2.0 parts by mass |

<Condition for uv Irradiation>

The layer A5 was cured with uv rays from a uv irradiation device provided with a belt conveyor (lamp: D bulb, made by Fusion UV Systems) in an accumulated light intensity of 1800 mJ/cm$^2$.

(Conditions for forming layer A6: storage elastic modulus=550 MPa)

The layer A6 was formed as in the method for forming the layer A1 used for preparation of the circularly polarizing plate 1 except that the composition of the coating solution for forming the layer A and the accumulated intensity of uv light for curing the layer A were modified as follows:

<Composition of Coating Solution for Layer A6>

| | |
|---|---|
| 3,4-Epoxycyclomethyl 3,4-epoxycyclohexanecarboxylate | 18 parts by mass |
| EPOLEAD GT-301 (alicyclic epoxy resin available from Daicel Corporation) | 67 parts by mass |
| 1,4-Butanediol diglycidyl ether | 15 parts by mass |
| Triallysulfonium hexafluorophosphate | 4.20 parts by mass |
| 9,10-Dibutoxyanthrathene | 0.1 parts by mass |
| 1,4-Diethoxynaphthalene | 2.0 parts by mass |

<Condition for uv Irradiation>

The layer A6 was cured with uv rays from a uv irradiation device provided with a belt conveyor (lamp: D bulb, made by Fusion UV Systems) in an accumulated light intensity of 1900 mJ/cm$^2$.

[Preparation of Circularly Polarizing Plate 16]

A circularly polarizing plate 16 was prepared as in the preparation of the circularly polarizing plate 10 except that a layer B1 is disposed between the protective film and the polarizer.

(Preparation of Coating Solution for Layer B1)

The following components were mixed and deaerated to prepare a coating solution for a layer B1. Triallysulfonium hexafluorophosphate was compounded in a form of a 50% solution in propylene carbonate. The following formulation indicates the solid content of triallysulfonium hexafluorophosphate.

<Preparation of Coating Solution for Layer B1>

| | |
|---|---|
| 3,4-epoxycyclomethyl 3,4-epoxycyclohexanecarboxylate | 55 parts by mass |
| EPOLEAD GT-301 (alicyclic epoxy resin available from Daicel Corporation) | 30 parts by mass |
| 1,4-Butanediol diglycidyl ether | 15 parts by mass |
| Triallysulfonium hexafluorophosphate | 3.50 parts by mass |
| 9,10-Dibutoxyanthrathene | 0.1 parts by mass |
| 1,4-Diethoxynaphthalene | 2.0 parts by mass |

(Preparation of Circularly Polarizing Plate)

A surface of each of the λ/4 retardation films 1 and KC4UA (available from Konica Minolta Advanced Layers, Inc.) was treated by corona discharge. The coating solution for forming a layer A3 was applied onto the treated surface of the λ/4 retardation film 1 with a bar coater into a cured thickness of about 3 μm as in the preparation of the circularly polarizing plate 10, was cured with uv rays in an accumulated intensity of 1200 mJ/cm$^2$ to form a layer A3. The resulting layer A3 was bonded to the polarizer face of the polarizing plate prepared as described above to complete a circularly polarizing plate. The coating solution for forming a layer B1 was applied onto the treated surface of the film KC4UA with a bar coater into a cured thickness of about 3 μm, was cured with uv rays in an accumulated intensity of 1200 mJ/cm$^2$ to form a layer B1. The resulting layer B1 was bonded to the polarizer face of the polarizing plate prepared as described above to complete a polarizing plate 16.

[Preparation of Circularly Polarizing Plates 17 to 20]

Circularly polarizing plate 17 to 20 were prepared as in the circularly polarizing plate 16 except that the type of the λ/4 retardation film, the type of the coating solution for the layer B, and the curing condition (described below) were varied to adjust the storage elastic modulus as shown in Table 1.

The layers B2 and B3 for forming each circularly polarizing plate were formed as follows:

(Conditions for Forming Layer B2: Storage Elastic Modulus=140 MPa)

The layer B2 was formed as in the method for forming the layer B1 used for preparation of the circularly polarizing plate 16 except that the composition of the coating solution for forming the layer B and the accumulated intensity of uv light for curing the layer B were modified as follows:

<Composition of Coating Solution for Forming Layer B2>

| | |
|---|---|
| 3,4-Epoxycyclomethyl 3,4-epoxycyclohexanecarboxylate | 60 parts by mass |
| EPOLEAD GT-301 (alicyclic epoxy resin available from Daicel Corporation) | 25 parts by mass |
| 1,4-Butanediol diglycidyl ether | 15 parts by mass |
| Triallysulfonium hexafluorophosphate | 2.70 parts by mass |
| 9,10Dibutoxyanthrathene | 0.1 parts by mass |
| 1,4-Diethoxynaphthalene | 2.0 parts by mass |

<Condition for uv Irradiation>

The layer B2 was cured with uv rays from a uv irradiation device provided with a belt conveyor (lamp: D bulb, made by Fusion UV Systems) in an accumulated light intensity of 900 mJ/cm².

(Conditions for Forming Layer B3: Storage Elastic Modulus=100 MPa)

The layer B3 was formed as in the method for forming the layer B1 used for preparation of the circularly polarizing plate 16 except that the composition of the coating solution for forming the layer B and the accumulated intensity of uv light for curing the layer B were modified as follows:

<Composition of Coating Solution for Forming Layer B3>

| | |
|---|---|
| 3,4-Epoxycyclomethyl 3,4-epoxycyclohexanecarboxylate | 63 parts by mass |
| EPOLEAD GT-301 (alicyclic epoxy resin available from Daicel Corporation) | 22 parts by mass |
| 1,4-Butanediol diglycidyl ether | 15 parts by mass |
| Triallysulfonium hexafluorophosphate | 2.40 parts by mass |
| 9,10Dibutoxyanthrathene | 0.1 parts by mass |
| 1,4-Diethoxynaphthalene | 2.0 parts by mass |

<Condition for uv Irradiation>

The layer B3 was cured with uv rays from a uv irradiation device provided with a belt conveyor (lamp: D bulb, made by Fusion WV Systems) in an accumulated light intensity of 800 mJ/cm².

<<Measurement of Various Characteristics of Circularly Polarizing Plate>>

[Measurement of Storage Elastic Modulus of Layers A and B]

The coating solutions for layers A1 to A6 and B1 to B3 used for preparation of the circularly polarizing plates were each applied onto a releasing layer of a 38 μm thick polyethylene terephthalate releasable film SP-PET3811 available from Lintec Corporation, was dried and cured with uv rays to form a layer, under the same conditions for preparation of the circularly polarization plates described above. The layer (single layer) was separated from the polyethylene terephthalate releasable film.

The resulting single film of each of the layers A and B was cut into a size of 3 cm by 1 cm, and the film was fixed with right and left grippers at intervals of 2 cm such that the longer side was the stretching direction. The storage elastic modulus at 25° C. was measured with a rheometer DVA-220 made by IT Keisoku Seigyo Kabusiki Kaisha.

[Measurement of Difference C in Size Variation Rate Between λ/4 Retardation Film with Layer a and Protective Film or Protective Film with Layer B]

The difference in size variation rate of each of the λ/4 retardation film provided with the layer A, the protective film, and the protective film provided with the layer B was determined as follows:

Each of the single protective film and the protective film provided with the layer B was moisturized for 24 hours in an environment at a temperature of 20° C. and a relative humidity of 55%. The film was marked at intervals of about 10 cm in the width and longitudinal directions with a cutter and the distance Lp (20° C.) therebetween was accurately measured. After the film was placed for 24 hours in an environment at a temperature of 80° C. and a relative humidity of 55%, the distance Lp (80° C.) between the cut marks was accurately measured. The size variation rate (absolute value) A of the protective film was determined from Expression (2):

$$\text{Size variation rate } A \text{ of protective film}=|\{(Lp(80° C.)-Lp(20° C.))/Lp(20° C.)\}\times 100|(\%) \quad \text{Expression (2)}$$

The sample of the λ/4 retardation film provided with the layer A was also moisturized for 24 hours in an environment at a temperature of 20° C. and a relative humidity of 55% to measure a reference size of Lq(20° C.) and then was placed for 24 hours in an environment at a temperature of 80° C. and a relative humidity of 55% to accurately determine the distance Lq(80° C.). The size variation rate (absolute value) B of the λ/4 retardation film provided with the layer A was determined from Expression (3):

$$\text{Size variation rate } B \text{ of } \lambda/4 \text{ retardation film with layer } A=|\{(Lq(80° C.)-Lq(20° C.))/Lq(20° C.)\}\times 100|(\%) \quad \text{Expression (3)}$$

The difference in size variation rate C (%) was calculated from Expression (1) using the size variation rate A of the protective film and the size variation rate B of the λ/4 retardation film provided with the layer A:

$$\text{Difference in size variation rate } C=|\{(Lp(80° C.)-Lp(20° C.))/Lp(20° C.)\}\times 100-|\{(Lq(80° C.)-Lq(20° C.))/Lq(20° C.)\}\times 100|(\%)$$

The results are shown in Table 1.

The spectral absorption characteristics of the single layer A was measured as follows:

[Measurement of Spectral Absorption Characteristics of Layer A]

Each of the coating solutions for layers A1 to A6 used for preparation of the circularly polarizing plates 1 to 3 and 7 to 20 was applied onto a releasing layer of a 38 μm thick polyethylene terephthalate releasable film (SP-PET3811 available from Lintec Corporation) into a cured thickness of about 3 μm with a bar coater, and was cured with uv rays of accumulated light intensity of 1200 mJ/cm² to form a layer A. The layer A (single layer A) was separated from the polyethylene terephthalate releasable film.

The spectral transmittance at 200 nm to 800 nm of the single layer A was measured with a spectrophotometer U-4000 made by Hitachi, Ltd. to find a maximum (λmax) of the absorption wavelength in the uv region of 200 nm to 400 nm. All the layers A had an absorption maximum in the uv region of 200 to 400 nm.

<<Preparation of Organic Electroluminescent Display Device>>

Figure 7:
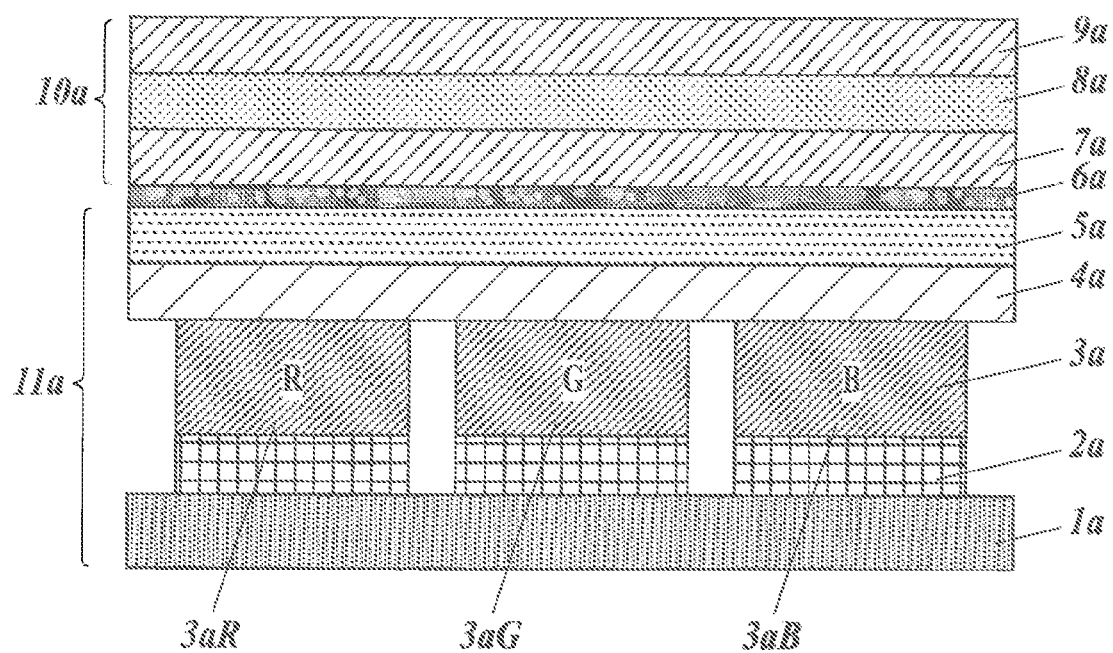
FIG. 7 is a schematic cross-sectional view illustrating the configuration of an organic electroluminescent display device fabricated in an example.

Organic electroluminescent display devices 1 to 20 having a structure shown in FIG. 7 were prepared.

[Preparation of Organic EL Display Element]

As shown in FIG. 7, a chromium reflective electrode was deposited over a transparent glass substrate 1a, an ITO electrode (anode) 2a was deposited over the reflective electrode, a hole transport layer of poly(3,4-ethylenedioxythiophene)-poly(ethylene sulfonate) (PEDOT:PSS) was deposited into a thickness of 80 nm by a sputtering process onto the anode, and then RGB organic luminescent layers 3aR, 3aG, and 3aB were deposited into a thickness of 100 nm through a shadow mask on the hole transport layer. The red organic luminescent layer 3aR was a 100 nm thick co-deposited film (mass ratio 99:1) of a host, aluminum tris(8-hydroxyquinolinate) (Alq), and a luminescent compound, [4-(dicyanomethylene)-2-methyl-6 (p-dimethylaminostyryl)-4H-pyran] (DCM). The green organic luminescent layer 3aG was a 100 nm thick co-deposited film (mass ratio 99:1) of a host, $Alq_3$, and a luminescent compound, coumalin 6. The blue organic luminescent layer 3aB was a 100 nm thick co-deposited film (mass ratio 90:10) of a host, BAlq, and a luminous compound, perylene.

[Chemical Formula 2]

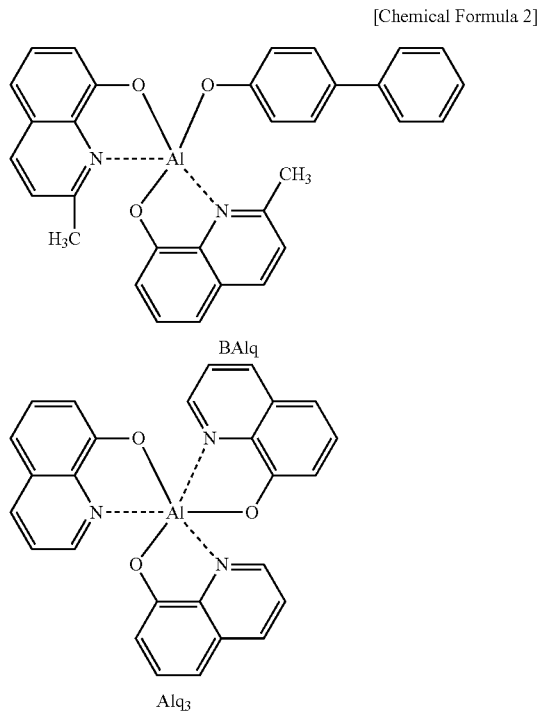

A first calcium cathode, which has a low work function to facilitate electron injection onto the organic luminescent layer, was formed into a thickness of 4 nm by a vacuum deposition process, and a second aluminum cathode was formed into a thickness of 2 nm on the first cathode. The second aluminum cathode can prevent the first calcium cathode from chemical alteration during the following sputtering process of a transparent electrode 4a on the second cathode. An organic luminescent layer was thereby prepared. A transparent conductive film was formed into a thickness of 80 nm by a sputtering process. The transparent conductive film was composed of ITO. A silicon nitride insulating layer 5a was formed into 200 nm by a CVD process on the transparent conductive film.

The resulting organic EL element had a luminous area of 1296 mm by 784 mm. The frontal luminance of the organic EL element was 1200 cd/m² at an applied DC voltage of 6V. The frontal luminance was an integrated intensity of visible light in the range of 430 to 480 nm at a view angle of 2 degrees with a spectroradiometer CS-1000 made by Konica Minolta Sensing in which the optical axis of the spectroradiometer coincides with the normal line to the luminescent surface.

[Preparation of Organic EL Display Devices 1 to 20]

The resulting organic EL display element was bonded to each of the circularly polarizing plates 1 to 20 provided with polarizers and λ/4 retardation films with an adhesive layer 6a. Organic EL display devices 1 to 20 having a structure shown in FIG. 7 were thereby fabricated.

<<Evaluation of Organic Electroluminescent Display Device>

[Evaluation of Visibility]

The visibility in a high-temperature high-humidity environment of each of the organic electroluminescent display devices produced as above was evaluated as follows: The visibility was visually observed at an angle of 40 degrees from the normal line to the screen of the organic electroluminescent display device under conditions A and B. In the condition A, the device placed in an environment (1) at a temperature of 23° C. and a relative humidity of 55% for 48 hours was observed such that the illuminance was 1000 Lx at a position 5 cm above the surface of the organic electroluminescent display device at a non-luminescent state (no voltage applied). In the condition B, the device placed in an environment (2) at a temperature of 40° C. and a relative humidity of 80% for 48 hours was observed such that the illuminance was 1000 Lx at a position 5 cm above the surface of the organic electroluminescent display device at a non-luminescent state (no voltage applied).

Ten persons compared the visibility under the condition A (normal-temperature normal-humidity aging) with that under the condition B (high-temperature high-humidity aging). Point 3 was given to substantially no change in the visibility between the condition B (high-temperature high-humidity aging) and the condition A (normal-temperature normal-humidity aging), point 2 to a slight decrease, point 1 to a small decrease, and point 0 to a distinct decrease. The visibility after high-temperature high-humidity aging was rated by the following criteria based on the total point of ten persons.

⊚: 27≤5: total, point
○: 24≤total point≤26
Δ: 18≤total point≤23
x: total point≤17

[Evaluation of Durability: Accelerated Aging Test]

Each of the organic electroluminescent display devices was subjected to an accelerated aging test including 1000 cycles of placing at 20° C. for 10 minutes in a dried environment (relative humid of 20% or less) and then at 50° C. for 10 minutes in a thermal impact testing machine, and then was taken out from the machine. The irregularity of the image in a white display mode after the aging was visually compared with that before the aging, and was rated based on the following criteria.

⊚: No difference was observed in quality of image in white display mode between before and after accelerated aging test
○: Slight irregularity in displayed image was observed after accelerated aging test
Δ: Minor irregularity in displayed image was observed after accelerated aging test
x: Distinct irregularity in displayed image was observed after accelerated aging test, some dead pixels were found.

[Evaluation of Durability of Aged Panel]

Each of the organic electroluminescent display devices 1 to 20 was also subjected to the accelerated aging test of 1000 cycles described above. The flatness (warpage) of the organic electroluminescent display device was compared with that of the unaged device and the durability of the aged panel was rated based on the following criteria.

⊚: Aged organic electroluminescent display device showed superior flatness without warpage
○: Aged organic electroluminescent display device showed excellent flatness substantially without warpage Δ: Aged organic electroluminescent display device showed slight practically allowable warpage
x: Aged organic electroluminescent display device showed impractical level of noticeable warpage
These results are shown in Table 1.

TABLE 1

| organic EL element display device No. | configuration of circularly polarizing plate | | | | | | difference in size variation rate C *3 | results | | | remark |
|---|---|---|---|---|---|---|---|---|---|---|---|
| | λ/4 retardation film number | layer A number | *1 | layer B number | *2 | protective film | | visibility | durability | durability of aged panel | |
| 1 | 1 | 1 | A1 | 90 | — | — | 4UA | 11.2 | X | X | X | comparative |
| 2 | 2 | 2 | A1 | 90 | — | — | 4UA | 10.5 | X | X | X | comparative |
| 3 | 3 | 3 | A1 | 90 | — | — | 4UA | 12.8 | X | X | X | comparative |
| 4 | 4 | 1 | — | — | — | — | 4UA | 14.5 | X | X | X | comparative |
| 5 | 5 | 2 | — | — | — | — | 4UA | 14.2 | X | X | X | comparative |
| 6 | 6 | 3 | — | — | — | — | 4UA | 15.1 | X | X | X | comparative |
| 7 | 7 | 1 | A2 | 100 | — | — | 4UA | 7.4 | Δ | Δ | Δ | inventive |
| 8 | 8 | 2 | A2 | 100 | — | — | 4UA | 7.1 | Δ | Δ | Δ | inventive |
| 9 | 9 | 3 | A2 | 100 | — | — | 4UA | 8.2 | Δ | Δ | Δ | inventive |
| 10 | 10 | 1 | A3 | 150 | — | — | 4UA | 6.3 | ○ | ○ | ○ | inventive |
| 11 | 11 | 2 | A3 | 150 | — | — | 4UA | 5.9 | ○ | ○ | ○ | inventive |
| 12 | 12 | 3 | A3 | 150 | — | — | 4UA | 6.5 | ○ | ○ | ○ | inventive |
| 13 | 13 | 1 | A4 | 180 | — | — | 4UA | 5.8 | ○ | ○ | ○ | inventive |
| 14 | 14 | 1 | A5 | 500 | — | — | 4UA | 7.4 | Δ | Δ | Δ | inventive |
| 15 | 15 | 1 | A6 | 550 | — | — | 4UA | 10.8 | X | X | X | comparative |
| 16 | 16 | 1 | A3 | 150 | B1 | 160 | 4UA | 5.7 | ○ | ○ | ○ | inventive |
| 17 | 17 | 1 | A3 | 150 | B2 | 140 | 4UA | 3.1 | ◎ | ◎ | ◎ | inventive |
| 18 | 18 | 1 | A3 | 150 | B3 | 100 | 4UA | 1.0 | ◎ | ◎ | ◎ | inventive |
| 19 | 19 | 2 | A3 | 150 | B3 | 100 | 4UA | 1.2 | ◎ | ◎ | ◎ | inventive |
| 20 | 20 | 3 | A3 | 150 | B3 | 100 | 4UA | 1.4 | ◎ | ◎ | ◎ | inventive |

*1: storage elastic modulus of layer A (MPa)
*comparative: comparative example
*2: storage elastic modulus of layer B (MPa)
*inventive: inventive example
*3: difference in size variation rate C (%) between protective film and λ/4

The results shown in Table 1 evidently show that the organic electroluminescent display devices including circularly polarizing plates having configurations defined by the present invention superior visibility, durability (stability under high-temperature high-humidity environments), and durability (flatness) of aged panels to the comparative devices.

INDUSTRIAL APPLICABILITY

The organic electroluminescent display device of the present invention exhibits superior visibility, durability (against irregularity in images), and durability against deterioration of the panel (high flatness) after long-term storage under high-temperature high-humidity environments, and is suitable for a variety of light sources, such as flat-panel illumination devices, light sources for optical fibers, back lights for liquid crystal displays and liquid crystal projectors, and other displays.

EXPLANATION OF SYMBOLS 4 original long film
5 long stretched film
6 diagonally stretching tenter
7-1 track of outside film holder
7-2 track of inside film holder
8-1 start point of outside film holder
8-2 start point of inside film holder
9-1 end point of outside film holder
9-2 end point of inside film holder
10-1 start point of outside diagonal stretching
10-2 start point of inside diagonal stretching
11-1 end point of outside diagonal stretching
11-2 end point of outside diagonal stretching
12-1 guide roller on tenter entrance side
12-2 guide roller on tenter exit side
13 film stretching direction
14-1 film conveyance direction before diagonal stretching
14-2 film conveyance direction after diagonal stretching
16 film feeder
17 moving direction changer
18 winder
19 film former
Wo film width length before diagonal stretching
W film width length after diagonal stretching
101, 1a substrate, transparent substrate
102, 2a metal electrode
103 organic luminescent layer
3aR red organic luminescent layer
3aG green organic luminescent layer
3aB blue organic luminescent layer
104, 4a transparent electrode
105, 5a insulating layer
106 sealing layer
6a adhesive layer
107 film
108, 7a, λ/4 retardation film
109, Ba polarizer
110, 9a polarizing-plate protective film
111 surface antireflective layer
112 layer A
113 layer B
A organic EL display device
10a, C circularly polarizing plate
11a, B organic EL display element

The invention claimed is:

1. An organic electroluminescent display device, comprising:
 a protective film, a polarizer, a λ/4 retardation film, and an organic electroluminescent element in sequence from a viewer side,
 wherein at least one face of the λ/4 retardation film is provided with a layer A having a storage elastic modulus in a range of 100 to 500 MPa, and
 wherein the layer A is disposed between the polarizer and the λ/4 retardation film, a layer B is disposed between the protective film and the polarizer, the storage elastic modulus A of the layer A is greater than the storage elastic modulus B of the layer B.

2. The organic electroluminescent display device of claim 1, wherein the protective film and the λ/4 retardation film provided with the layer A have a difference in size variation rate C in a range of 0.1 to 10.0%, the difference being defined by Expression (1):

$$\text{Difference in size variation rate } C = |\{(Lp(80°\text{ C.}) - Lp(20°\text{ C.}))/Lp(20°\text{ C.})\} \times 100| - |\{(Lq(80°\text{ C.}) - Lq(20°\text{ C.}))/Lq(20°\text{ C.})\} \times 100|(\%) \quad \text{Expression (1)}$$

where Lp(20° C.) is a reference size of the protective film at 20° C., Lp(80° C.) is a size of the protective film at 80° C., Lq(20° C.) is a reference size of the λ/4 retardation film provided with the layer A at 20° C., and Lq(80° C.) is a size of the λ/4 retardation film provided with the layer A at 80° C.

3. The organic electroluminescent display device of claim 1, wherein the layer A has an absorption maximum in a wavelength range of 200 to 400 nm.

4. The organic electroluminescent display device of claim 1, wherein the layer A contains a uv curable resin.

5. A circularly polarizing plate, comprising:
 a protective film, a polarizer, and a λ/4 retardation film in sequence,
 wherein at least one face of the λ/4 retardation film is provided with a layer A having a storage elastic modulus in a range of 100 to 500 MPa, and
 wherein the layer A is disposed between the polarizer and the λ/4 retardation film, a layer B is disposed between the protective film and the polarizer, the storage elastic modulus A of the layer A is greater than the storage elastic modulus B of the layer B.

6. The circularly polarizing plate of claim 5, wherein the protective film and the λ/4 retardation film provided with the layer A have a difference in size variation rate C in a range of 0.1 to 10.0%, the difference being defined by Expression (1):

$$\text{Difference in size variation rate } C = |\{(Lp(80°\text{ C.}) - Lp(20°\text{ C.}))/Lp(20°\text{ C.})\} \times 100| - |\{(Lq(80°\text{ C.}) - Lq(20°\text{ C.}))/Lq(20°\text{ C.})\} \times 100|(\%) \quad \text{Expression (1)}$$

where Lp(20° C.) is a reference size of the protective film at 20° C., Lp(80° C.) is a size of the protective film at 80° C., Lq(20° C.) is a reference size of the λ/4 retardation film provided with the layer A at 20° C., and Lq(80° C.) is a size of the λ/4 retardation film provided with the layer A at 80° C.

7. The circularly polarizing plate of claim 5, wherein the layer A has an absorption maximum in a wavelength range of 200 to 400 nm.

8. The circularly polarizing plate of claim 5, wherein the layer A contains a uv curable resin.

* * * * *